(12) United States Patent
Mizuno

(10) Patent No.: US 10,285,287 B2
(45) Date of Patent: May 7, 2019

(54) POWER CONVERSION APPARATUS AND METHOD OF PRODUCING THE SAME

(71) Applicant: DENSO CORPORATION, Kariya, Aichi-pref. (JP)

(72) Inventor: Yukinori Mizuno, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/006,161

(22) Filed: Jun. 12, 2018

(65) Prior Publication Data

US 2018/0359870 A1 Dec. 13, 2018

(30) Foreign Application Priority Data

Jun. 13, 2017 (JP) ................. 2017-116015

(51) Int. Cl.
| | |
|---|---|
| H05K 5/00 | (2006.01) |
| H02K 11/33 | (2016.01) |
| H02M 7/00 | (2006.01) |
| H05K 1/18 | (2006.01) |
| H05K 3/30 | (2006.01) |

(Continued)

(52) U.S. Cl.
CPC ........... *H05K 5/0069* (2013.01); *H02K 11/33* (2016.01); *H02M 7/003* (2013.01); *H02M 7/5387* (2013.01); *H05K 1/184* (2013.01); *H05K 3/0008* (2013.01); *H05K 3/306* (2013.01); *H05K 5/0043* (2013.01); *H05K 5/0065* (2013.01); *H01L 23/46* (2013.01); *H02P 5/74* (2013.01); *H05K 2201/10151* (2013.01);

(Continued)

(58) Field of Classification Search
CPC .... H05K 5/0069; H05K 1/184; H05K 3/0008; H05K 3/306; H05K 5/0043; H05K 5/0065; H05K 2201/10151; H05K 2201/10166; H05K 2201/10522; H05K 2203/0169; H02K 11/33; H02M 7/003; H02M 7/5387; H01L 23/46; H02P 5/74
See application file for complete search history.

(56) References Cited

U.S. PATENT DOCUMENTS

| | | | | |
|---|---|---|---|---|
| 2006/0284308 A1* | 12/2006 | Harada | ................. | H01L 25/072 257/729 |
| 2007/0018197 A1* | 1/2007 | Mochida | ............... | H01L 25/105 257/177 |

(Continued)

*Primary Examiner* — James Wu
*Assistant Examiner* — Hung Q Dang
(74) *Attorney, Agent, or Firm* — Oliff PLC

(57) ABSTRACT

An electronic component includes a main body and signal terminals projecting in a projection direction of a module control terminal, the signal terminals being arranged in an arrangement direction. Through-holes are formed in a control board, and the signal terminals are inserted into the through-holes. In a case, an opening that opens in the projection direction is formed, and ends of the signal terminals are positioned in the projection direction. At a position adjacent to a through-hole group including the through-holes in the arrangement direction, a communication space is formed which makes a first space, which is positioned at a side of electronic component in the projection direction, communicate with a second space opposite to the first space. When a length of the through-hole group is a, and a distance between the through-hole group and the communication space is b, a length of the communication space is longer than a+b.

8 Claims, 24 Drawing Sheets

(51) Int. Cl.
*H05K 3/00* (2006.01)
*H02M 7/5387* (2007.01)
*H02P 5/74* (2006.01)
*H01L 23/46* (2006.01)

(52) U.S. Cl.
CPC ........... *H05K 2201/10166* (2013.01); *H05K 2201/10522* (2013.01); *H05K 2203/0169* (2013.01)

(56) References Cited

U.S. PATENT DOCUMENTS

| | | | |
|---|---|---|---|
| 2011/0194322 A1* | 8/2011 | Nakasaka | H05K 7/20927 363/141 |
| 2011/0199736 A1* | 8/2011 | Sawada | H05K 7/20909 361/722 |
| 2011/0261600 A1* | 10/2011 | Tachibana | H02M 7/003 363/131 |
| 2011/0285010 A1* | 11/2011 | Miyachi | H01L 23/367 257/706 |
| 2012/0008282 A1* | 1/2012 | Ide | H01L 23/4334 361/702 |
| 2013/0285191 A1* | 10/2013 | Inamura | H01L 27/02 257/499 |
| 2015/0222039 A1 | 8/2015 | Akiguchi et al. | |
| 2016/0352215 A1* | 12/2016 | Momose | B60L 11/18 |

* cited by examiner

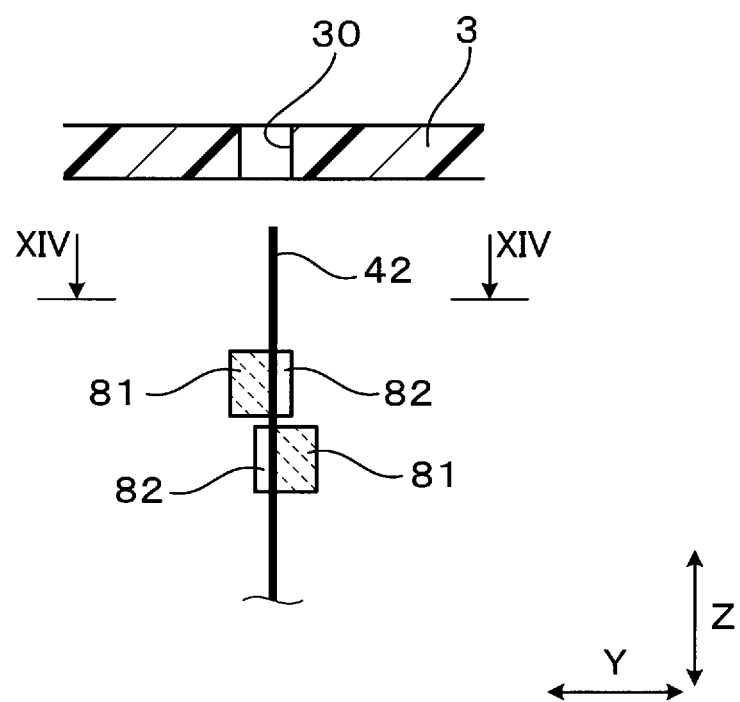
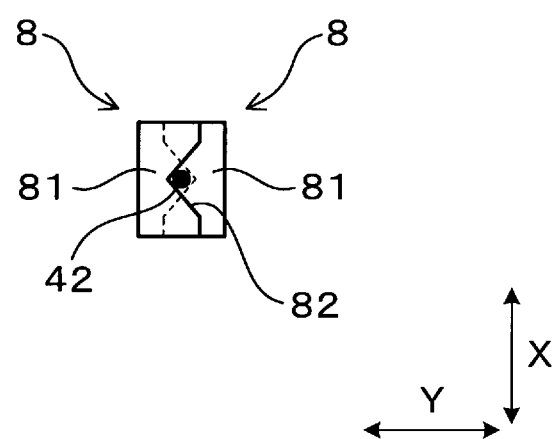

POWER CONVERSION APPARATUS AND METHOD OF PRODUCING THE SAME

CROSS-REFERENCE TO RELATED APPLICATION

This application is based on and claims the benefit of priority from earlier Japanese Patent Application No. 2017-116015 filed Jun. 13 2017, the description of which is incorporated herein by reference.

BACKGROUND

Technical Field

The present disclosure relates to a power conversion apparatus that includes a semiconductor module including semiconductor elements, a control board controlling operation of the semiconductor elements, and an electronic component connected to the control board, and a method of producing the same.

Related Art

A power conversion apparatus is known which performs power conversion from DC power to AC power and vice versa and includes a semiconductor module including semiconductor elements, a control board controlling operation of the semiconductor elements (refer to JP-A-2015-146290). The power conversion apparatus makes the semiconductor elements perform switching operation to convert DC power supplied from a DC power supply to AC power.

In addition, the power conversion apparatus includes electronic components such as a current sensor. The electronic components are electrically connected to the control board. The semiconductor module, the control board, and the electronic components are housed in a case.

In the above power conversion apparatus, the control board and the electronic component are provided with respective connectors, which are connected with each other by wires (refer to FIG. 26). Thereby, the electronic components are electrically connected to the control board.

However, if vibration is applied to the power conversion apparatus from the outside, the wires are shaken, and stress is applied to the connectors, whereby the life of the connectors may shorten. Hence, increasing vibration resistance of power conversion apparatuses is being studied. For example, a study is being conducted for forming a through hole in a control board and extending a signal terminal from an electronic component so as to be inserted into the through hole. According to this, since the electronic component and the control board can be connected by the signal terminal having high rigidity, the vibration resistance can be improved.

Recently, it is desired to further decrease power conversion apparatuses in size. Hence, a study is conducted for locating an end of the signal terminal inside a case with respect to an opening of the case and in an opening direction (refer to FIG. 1). According to this, since the end of the signal terminal does not project outside the case from the opening, the power conversion apparatus can be decreased in size.

However, if the signal terminal of the electronic component is inserted into the through hole of the control board, the signal terminal must be aligned with the through hole when the power conversion apparatus is produced. Hence, when the power conversion apparatus is produced, a step of inserting a positioning jig is necessary from outside the case to inside the case and in the direction orthogonal to the opening direction and of aligning the signal terminal with the through hole. However, as described above, when the end of the signal terminal is located inside the case with respect to the opening of the case and in the opening direction, the jig cannot be inserted from outside the case because of the presence of a sidewall of the case.

SUMMARY

An embodiment provides a power conversion apparatus whose vibration resistance is improved and which is further decreased in size, and a method of producing the same.

As an aspect of the embodiment, a power conversion apparatus is provided which includes: a semiconductor module that includes a module main body including a semiconductor element, and a module control terminal projecting from the module main body; a control board that is connected to the module control terminal and controls switching operation of the semiconductor element; an electronic component that is connected to the control board; and a case that houses the semiconductor module, the control board, and the electronic component.

The electronic component includes a component main body and a plurality of signal terminals that project from the component main body in a projection direction of the module control terminal, the plurality of signal terminals being arranged in an arrangement direction orthogonal to the projection direction. A plurality of through holes are formed in the control board, and the signal terminals are inserted into the respective through holes. In the case, an opening that opens in the projection direction is formed, and ends of the signal terminals are positioned inward in the projection direction with respect to the opening. At a position adjacent to at least one through hole group, which includes the plurality of through holes, in the arrangement direction, a communication space is formed which makes a first space, which is positioned at a side of the electronic component in the projection direction with respect to the control board, communicate with a second space opposite to the first space with referenced to the control board. When a length of the through hole group in the arrangement direction is a, and a distance between the through hole group and the communication space in the arrangement direction is b, a length of the communication space in the arrangement direction is longer than a+b.

BRIEF DESCRIPTION OF THE DRAWINGS

In the accompanying drawings:

FIG. 4 is a drawing obtained by removing a control board from FIG. 3 to omit a laminate and the like;

FIG. 13 is a view continued from FIG. 11;

FIG. 14 is a XIV-XIV sectional view of FIG. 13;

DETAILED DESCRIPTION OF THE PREFERRED EMBODIMENTS

First Embodiment

Figure 1:
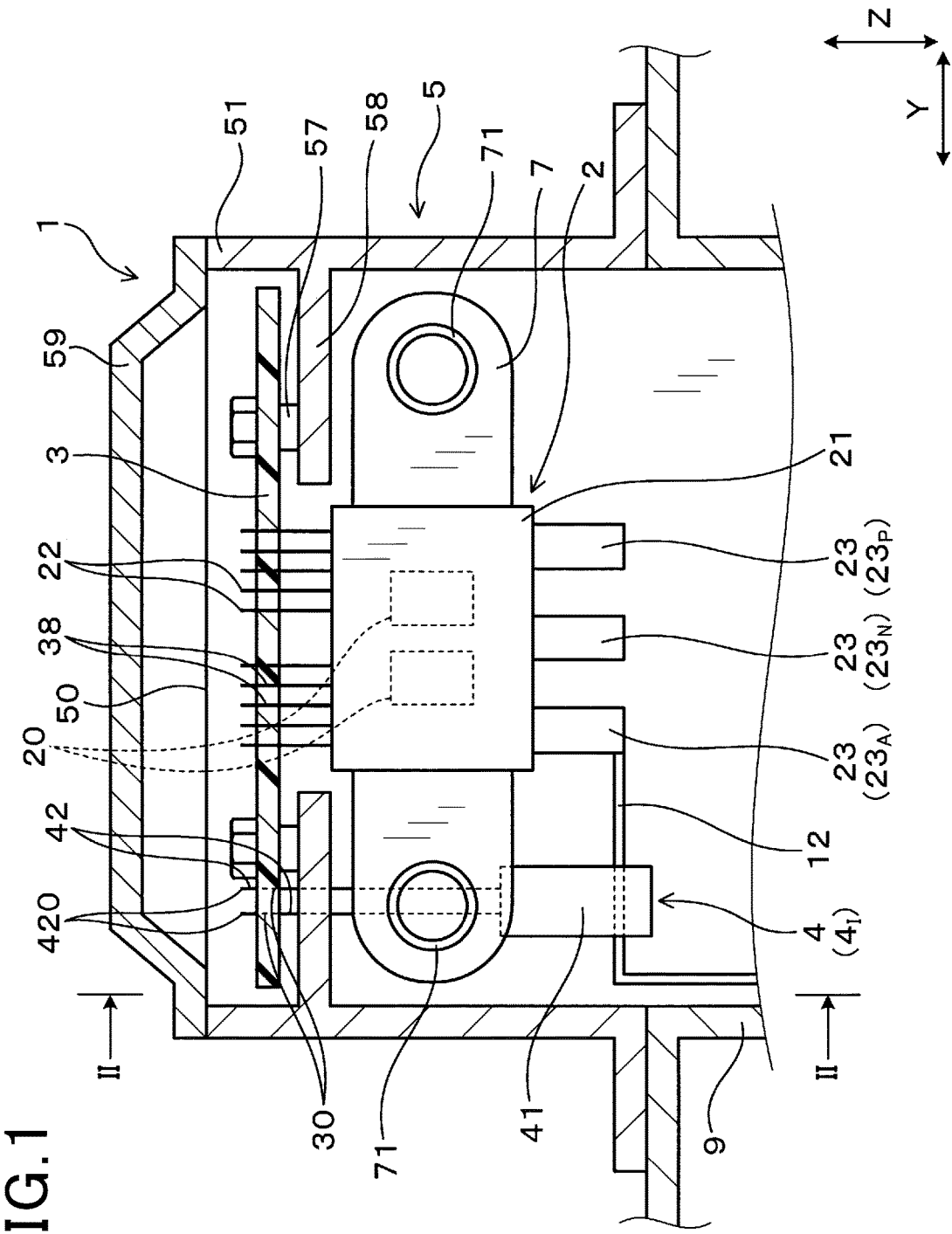
FIG. 1 is a sectional view of a power conversion apparatus according to a first embodiment, and a I-I sectional view of FIG. 2.
Figure 2:
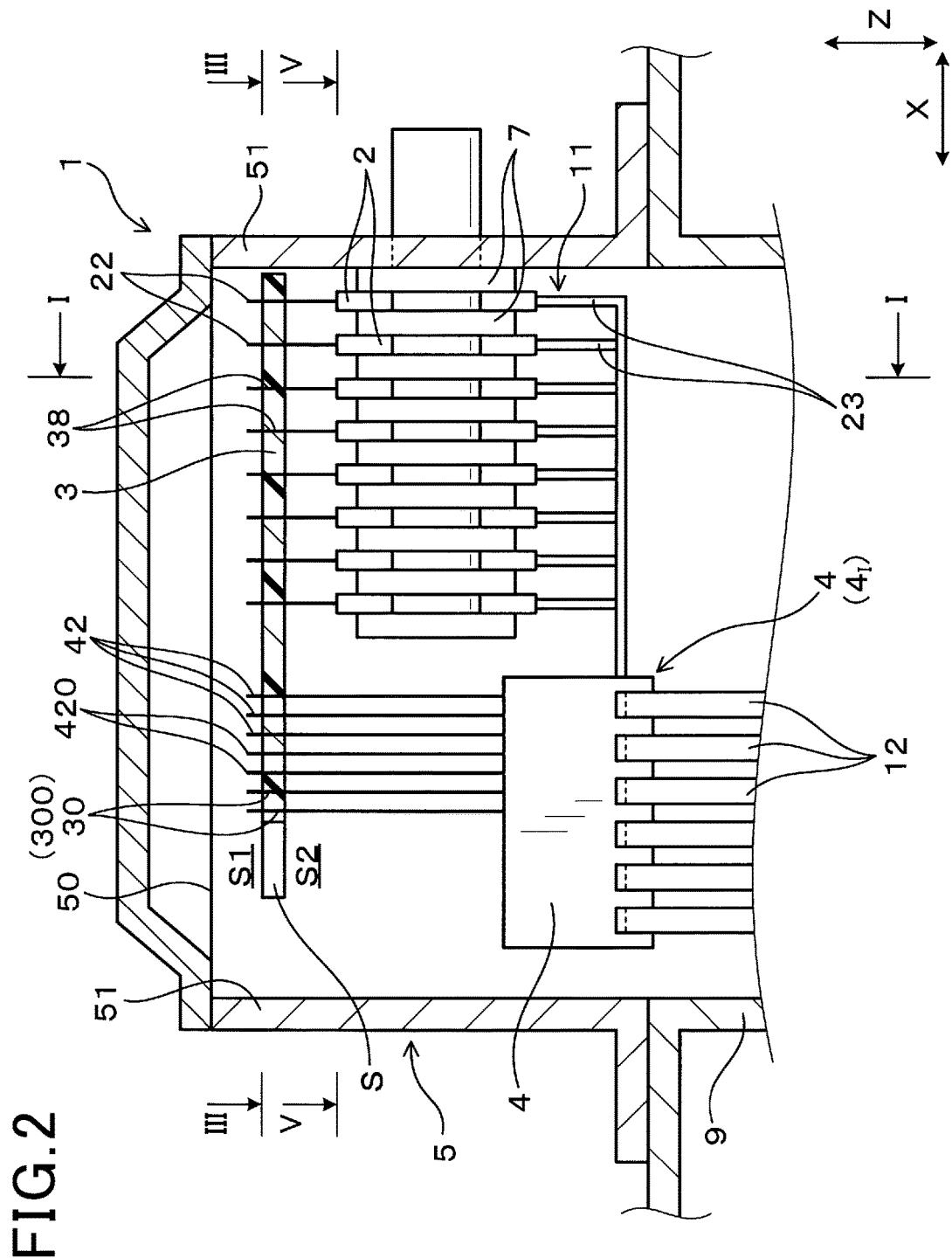
FIG. 2 is a II-II sectional view of FIG. 1.
Figure 3:
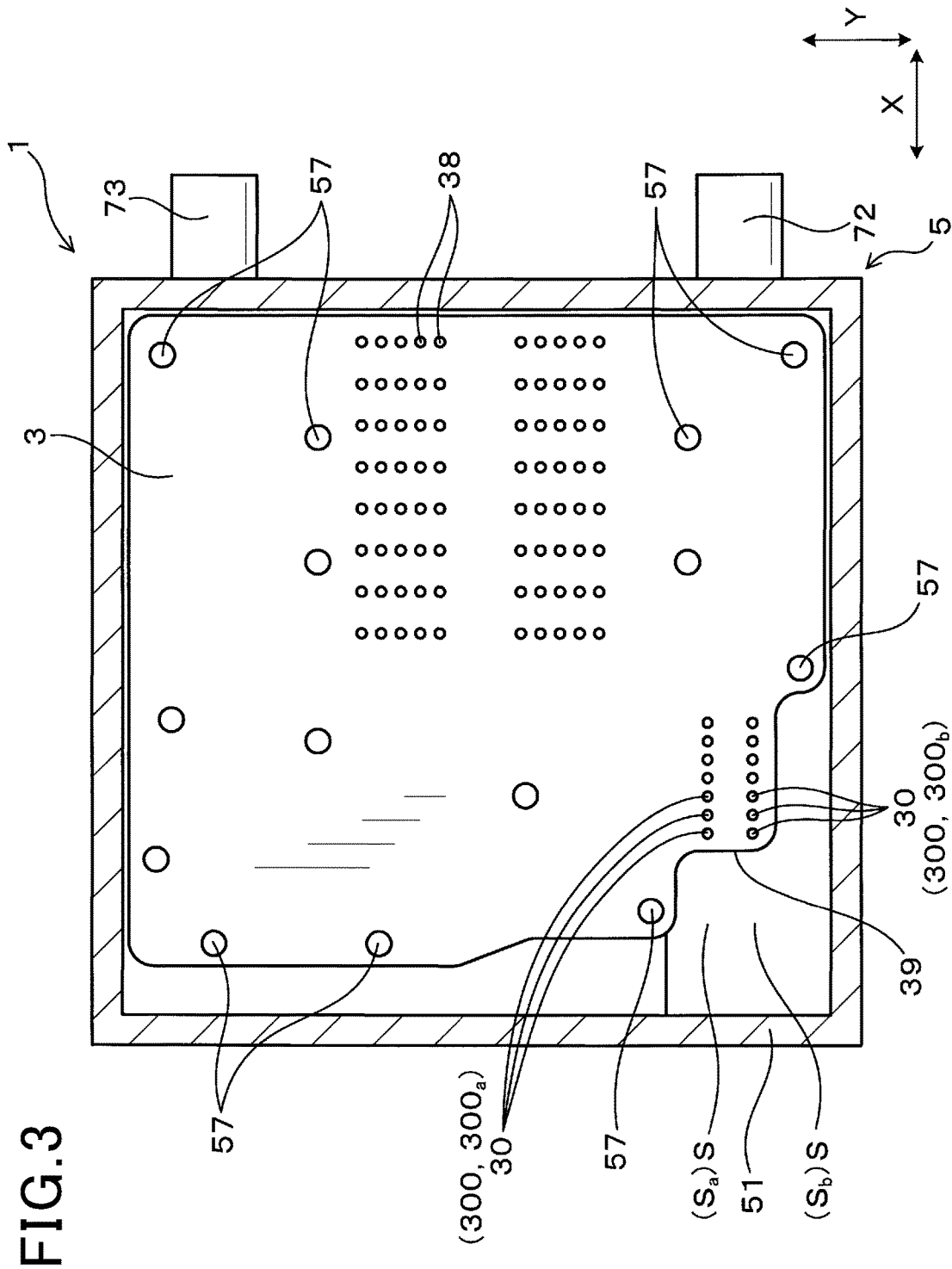
FIG. 3 is a III-III sectional view of FIG. 2.
Figure 4:
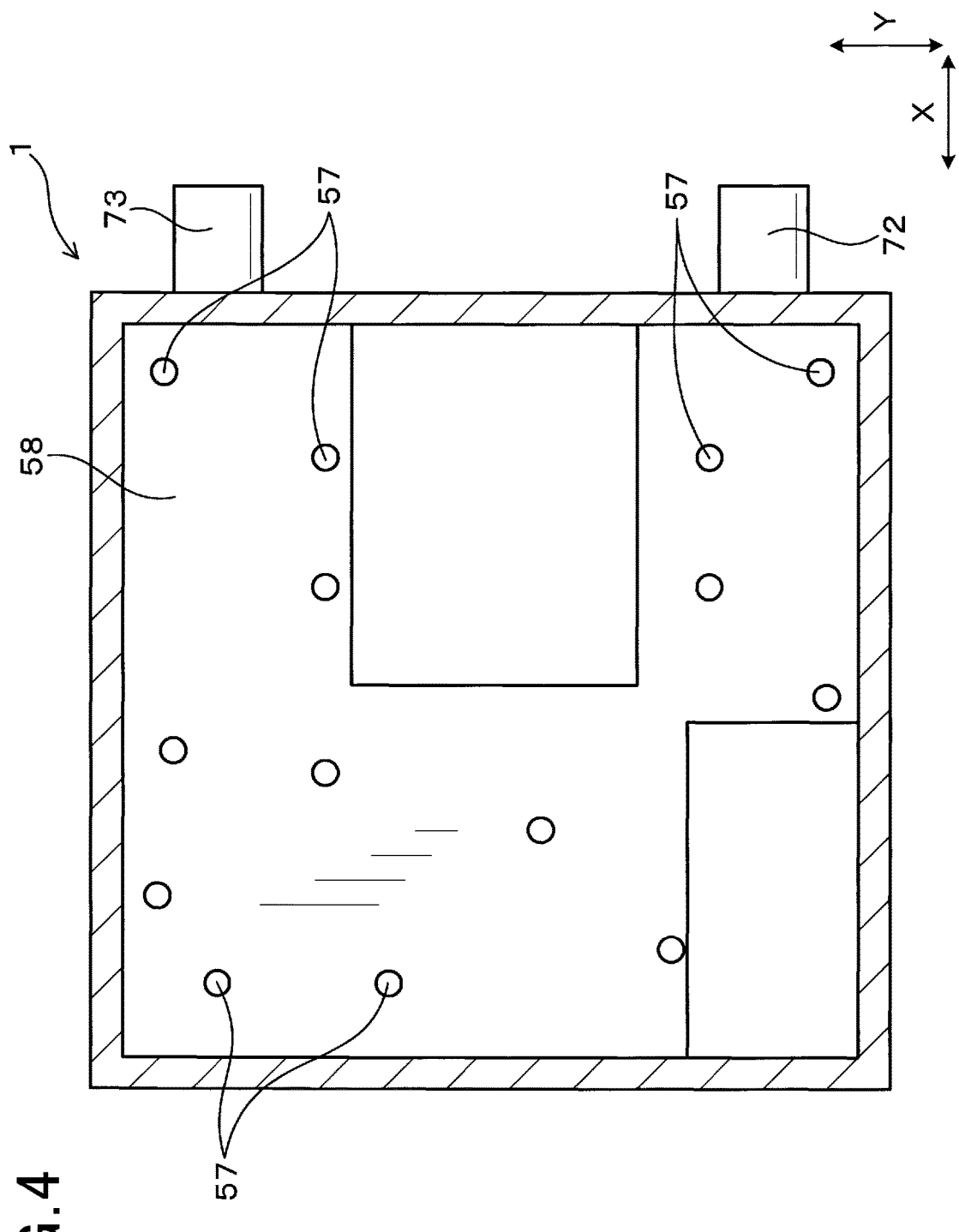

An embodiment of a power conversion apparatus will be described with reference to FIG. 1 to FIG. 15. As shown in FIG. 1 to FIG. 3, a power conversion apparatus 1 of the present embodiment includes a semiconductor module 2, a control board 3, an electronic component 4, and a case 5. The semiconductor module 2 includes a module main body 21 including semiconductor elements 20, and module control terminals 22 projecting from the module main body 21.

The control board 3 is connected to the module control terminals 22. The control board 3 controls switching operation of the semiconductor elements 20.

The electronic component 4 is connected to the control board 3. The electronic component 4 is separated from the semiconductor module 2. The electronic component 4 of the present embodiment is a current sensor $4_I$.

The semiconductor module 2, the control board 3, and the electronic component 4 are housed in the case 5.

The electronic component 4 includes a component main body 41 and a plurality of signal terminals 42. The component main body 41 includes electronic elements 49 (refer to FIG. 15) such as Hall elements. The signal terminals 42 project from the component main body 41 in a projection direction (Z direction) of the module control terminals 22. The signal terminals 42 are arranged in an arrangement direction (X direction) orthogonal to the Z direction. Each of the signal terminals 42 is longer than the module control terminals 22.

A plurality of through holes 30 are formed in the control board 3. The signal terminals 42 are inserted into the respective through holes 30.

In the case 5, an opening 50 opening in the Z direction is formed. Ends 420 of the signal terminals 42 are positioned in the case and inward in the Z direction with respect to the opening 50.

As shown in FIG. 2 and FIG. 3, at the position adjacent to a through hole group 300, which consists of the plurality of through holes 30, in the X direction, a communication space S that makes a space S1, which is positioned at the electronic component 4 side in the Z direction with respect to the control board 3, communicate with a space S2 on the opposite side of the space S1 from the control board 3.

Figure 8:
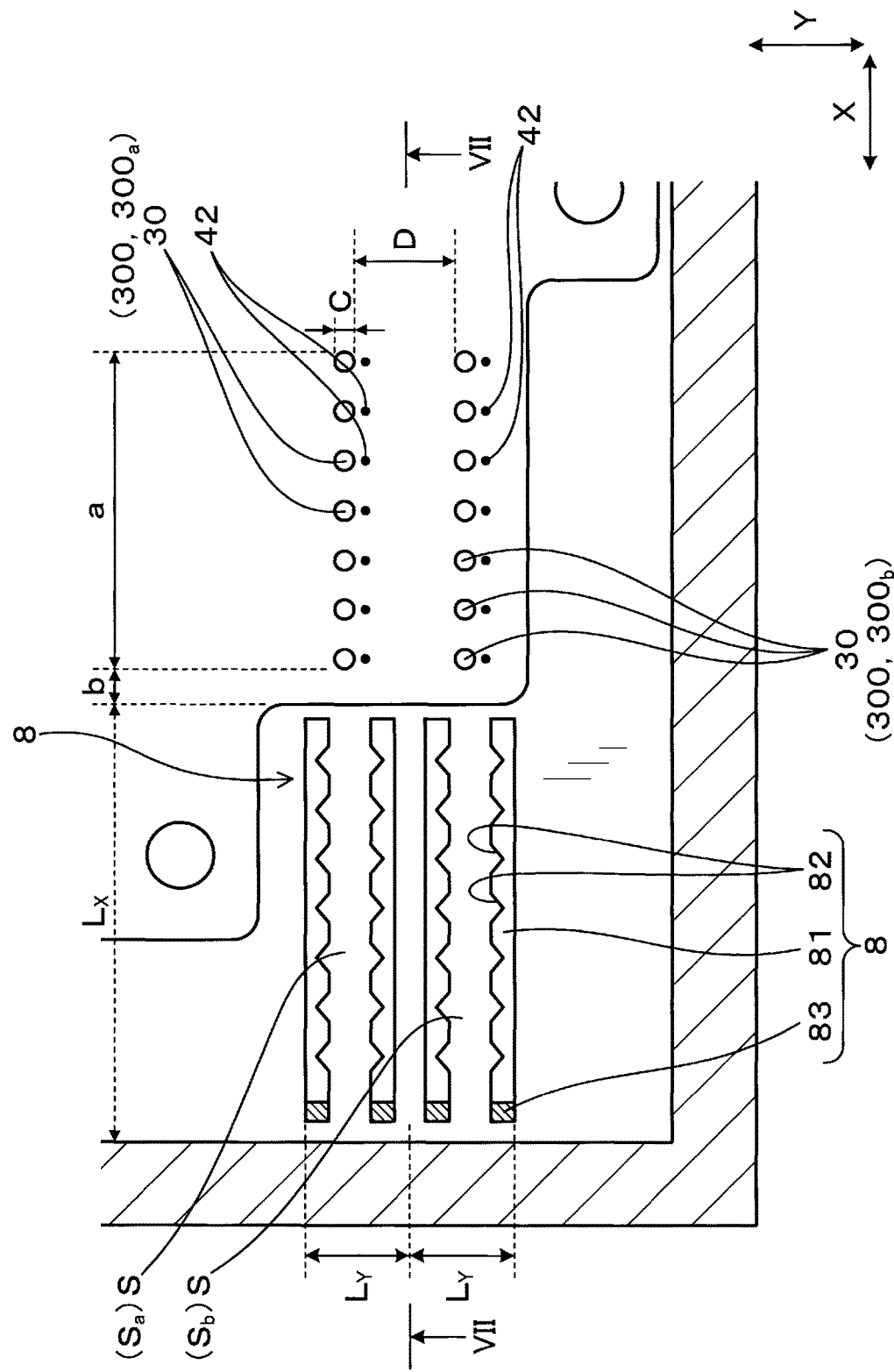
FIG. 8 is a view taken in the direction of an arrow VIII of FIG. 7.

As shown in FIG. 8, when the length of the through hole group 300 in the X direction is a, and the distance between the through hole group 300 and the communication space S in the X direction is b, the length $L_x$ of the communication space S in the X direction is longer than a+b.

More specifically, the length $L_X$ of the communication space S in the X direction is a+b+4 (mm) or more. In addition, when the diameter of the through hole 30 is c, the length $L_Y$ of the communication space S in the orthogonal direction (Y direction) orthogonal to both the X and Z directions is 3c or more.

As shown in FIG. 8, in the present embodiment, the plurality of through holes 30 are arranged in two rows. That is, in the control board 3, two through hole groups 300, which are a first through hole group $300_a$ and a second through hole group $300_b$, are formed. A first communication space $S_a$ is formed at a position adjacent to the first through hole group $300_a$. A second communication space $S_b$ is formed at a position adjacent to the second through hole group $300_b$. The two communication spaces $S_a$ and $S_b$ communicate with each other.

Figure 15:
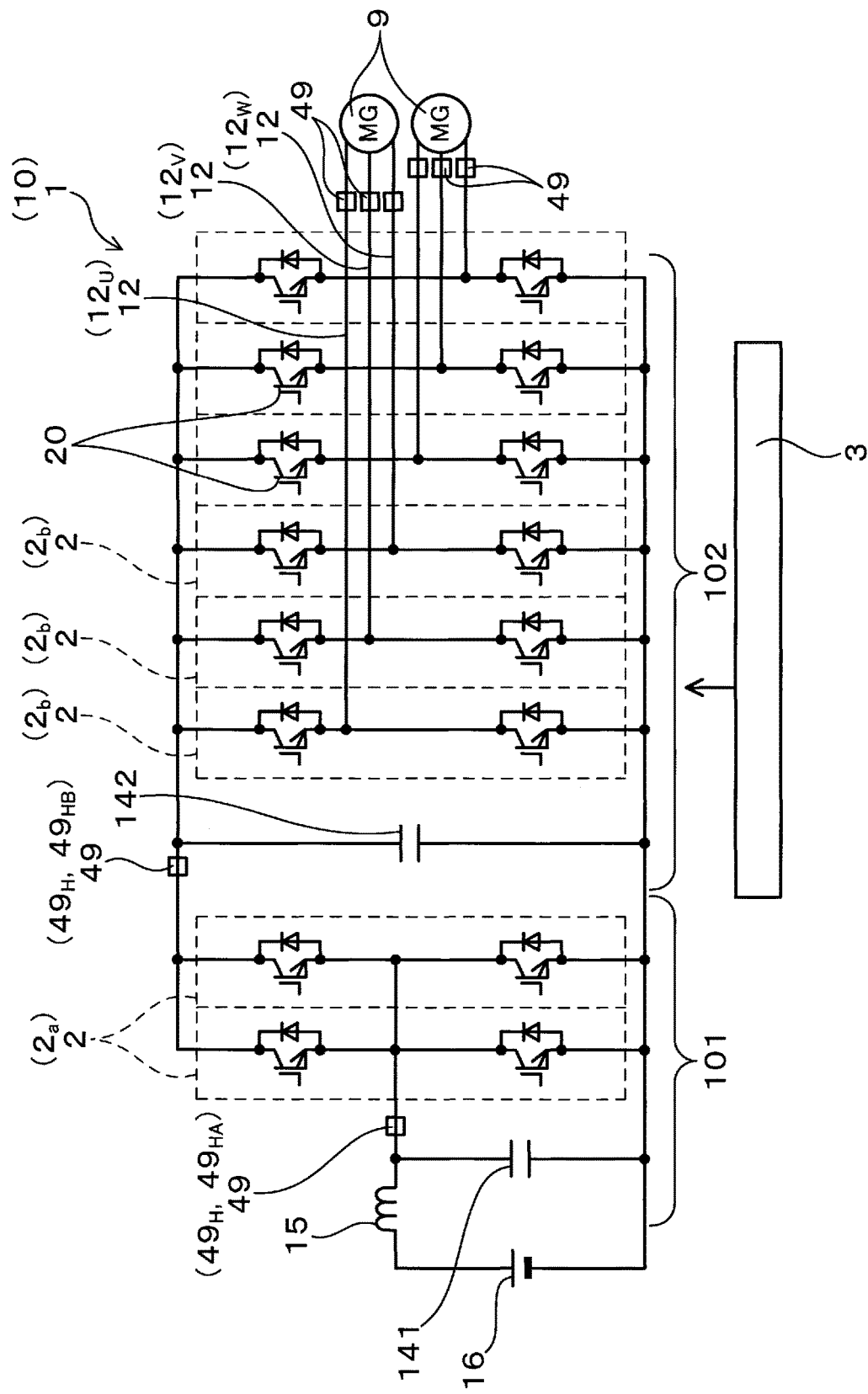
FIG. 15 is a circuit diagram of the power conversion apparatus according to the first embodiment.

The power conversion apparatus 1 of the present embodiment is an in-vehicle power conversion apparatus to be installed in a vehicle such as an electrical vehicle or a hybrid vehicle. As shown in FIG. 15, the power conversion apparatus 1 includes a plurality of semiconductor modules 2, a boosting reactor 15, a filter capacitor 141, and a smoothing capacitor 142. Each of the semiconductor modules 2 includes semiconductor elements 20 (IGBTs). A boosting circuit 101 is configured by the boosting reactor 15, the filter capacitor 141, and semiconductor modules $2_a$ (some of the semiconductor modules 2). In addition, an inverter circuit 102 is configured by semiconductor modules $2_b$ (the other of the semiconductor modules 2) and the smoothing capacitor 142. The boosting circuit 101 is used to increase voltage of a DC power supply 16. The inverter circuit 102 is used to convert the DC power after the voltage increase to AC power. Thereby, an AC motor 9 is driven, whereby the vehicle runs.

Hall elements $49_H$ (electronic elements 49) are attached to AC bus bars 12 ($12_u$, $12_v$, $12_w$) connecting the semiconductor modules 2 and the AC motor 9. Currents flowing through the AC bus bars 12 are measured by using the respective Hall elements $49_H$. In addition, a Hall element $49_{HA}$ is attached between the reactor 15 and the semiconductor modules $2_a$. The Hall element $49_{HA}$ is used to measure a current before voltage increase. Furthermore, a Hall element $49_{HB}$ is attached also to the inverter circuit 102. The Hall element $49_{HB}$ is used to measure a current after voltage increase. These Hall elements $49_H$ are included in the component main body 41 of the electronic component 4 (current sensor $4_I$) described above. As described above, since the electronic component 4 of the present embodiment includes a plurality of Hall elements $49_H$, the electronic component 4 has the plurality of signal terminals 42 to be connected to the control board 3 (refer to FIG. 1 and FIG. 5).

As shown in FIG. 1, the semiconductor module 2 includes the module main body 21 including the semiconductor elements 20, the module control terminals 22 projecting from the module main body 21, and a plurality of power terminals 23. The power terminals 23 project in the Z direction opposite to the direction in which the module control terminals 22 project. A plurality of module through holes 38 are formed in the control board 3. The module control terminals 22 are inserted into the respective module through holes 38. Since the module control terminals 22 are short, the module control terminals 22 can be inserted into the module through holes 38 without alignment using a jig 8 (refer to FIG. 7) when the power conversion apparatus 1 is produced.

The power terminals 23 include an AC terminal $23_A$ electrically connected to the AC motor 9, and a positive electrode terminal $23_P$ and a negative electrode terminal $23_N$ to which DC voltage is applied. The AC terminal $23_A$ is connected with the AC bus bar 12 to which the electronic component 4 (current sensor $4_I$) is attached.

As shown in FIG. 1, in the present embodiment, the power conversion apparatus 1 is attached to the AC motor 9. Hence, the power conversion apparatus 1 requires high vibration resistance. In addition, the case 5 is provided with a partition wall 58. The partition wall 58 is provided with a plurality of posts 57 (refer to FIG. 4) for supporting the control board 3. Hence, the control board 3 is firmly held by the partition wall 58, thereby enhancing the vibration resistance.

In addition, the control board 3 is disposed in the case and inward in the Z direction with respect to the opening 50 of the case 5. The opening 50 is closed by a cover 59. Also inside the cover 59, other components, not shown, are arranged.

Figure 5:
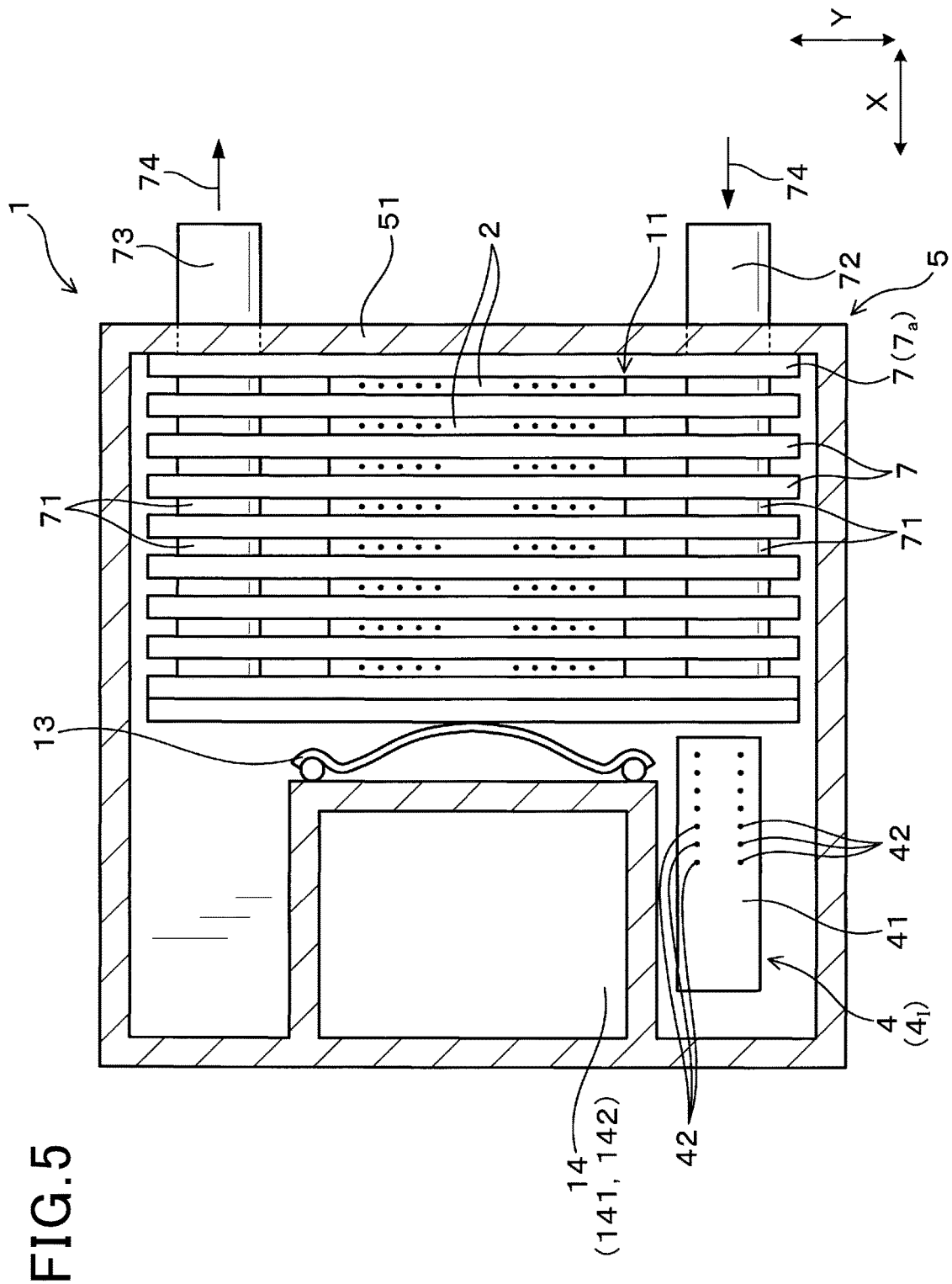
FIG. 5 is a V-V sectional view of FIG. 2.

As shown in FIG. 5, in the present embodiment, a laminated body 11 is formed by laminating the plurality of semiconductor modules 2 and cooling tubes 7 cooling the semiconductor modules 2. The two cooling tubes 7 adjacent to each other in the X direction are connected by connecting tubes 71. The connecting tubes 71 are arranged at both ends of the cooling tubes 7 in the Y direction. In addition, an inlet pipe 72 for introducing a coolant 74 and an outlet pipe 73 for discharging the coolant 74 are attached to an end cooling tube 7a positioned at an end of the case 5 in the X direction. When the coolant 74 is introduced from the inlet pipe 72, the coolant 74 passes through the connecting tube 71, flows through all the cooling tubes 7, and then is discharged from the outlet pipe 73. Thereby, the semiconductor modules 2 are cooled.

In addition, a capacitor module 14 is disposed in the case 5. The capacitor module 14 includes the filter capacitor 141 and the smoothing capacitor 142 described above. A pressing member 13 (plate spring) is disposed between the capacitor module 14 and the laminated body 11. The pressing member 13 presses the laminated body toward a sidewall 51 of the case 5. Thereby, contact pressure between the cooling tubes 7 and the semiconductor modules 2 is ensured, and the laminated body 11 is fixed in the case 5.

Next, a method of producing the power conversion apparatus 1 will be described. In the present embodiment, when the power conversion apparatus 1 is produced, a board arrangement step (refer to FIG. 6), an alignment step (refer to FIGS. 7 to 14), and an insertion step (refer to FIG. 2) are performed.

Figure 6:
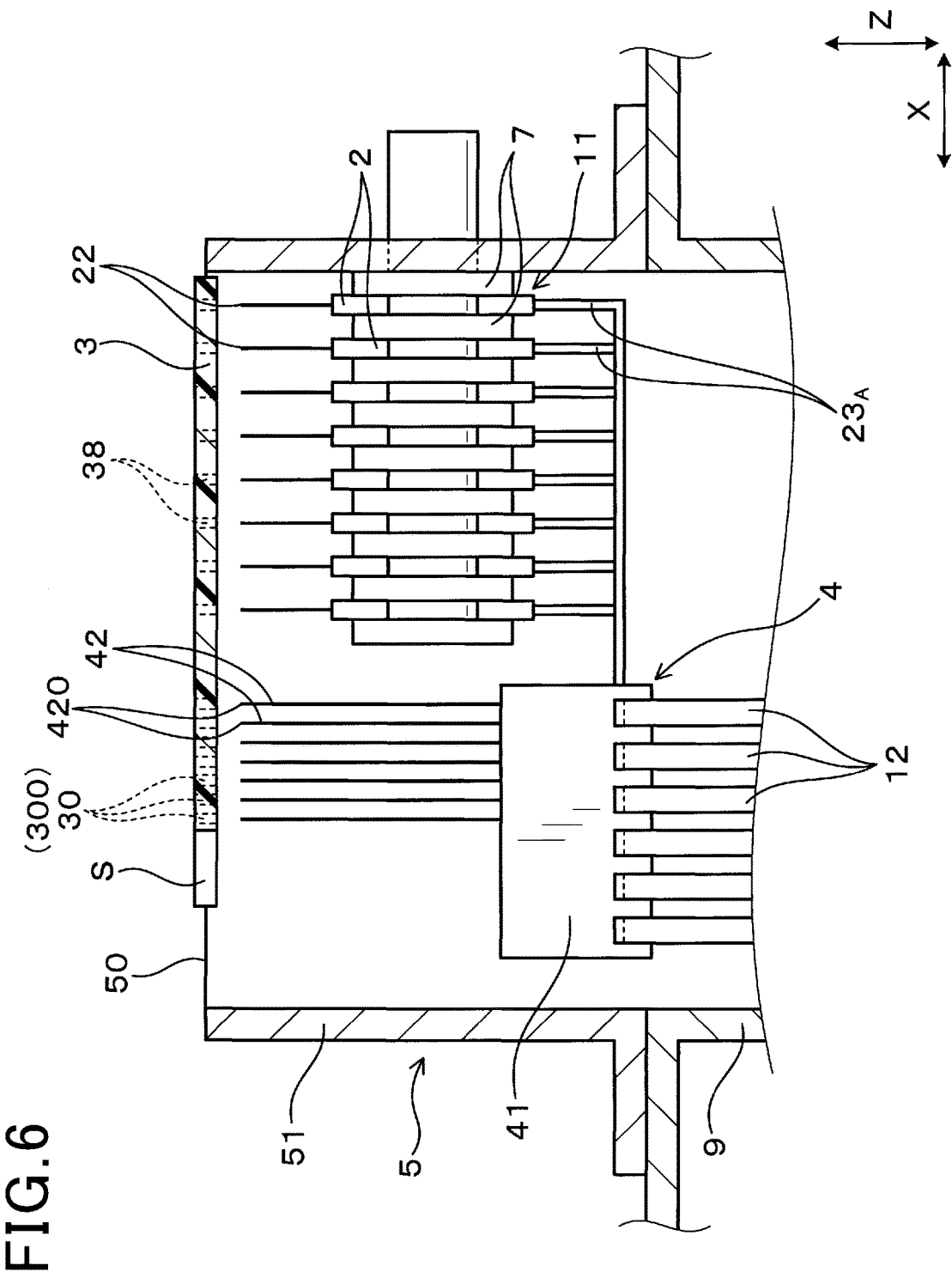
FIG. 6 is an explanatory drawing of a board arrangement step according to the first embodiment.

As shown in FIG. 6, in the board arrangement step, the case 5 houses the semiconductor modules 2 and the electronic components 4. Then, the control board 3 is disposed at a position adjacent to the semiconductor modules 2 and the electronic components 4 in the Z direction.

Figure 7:
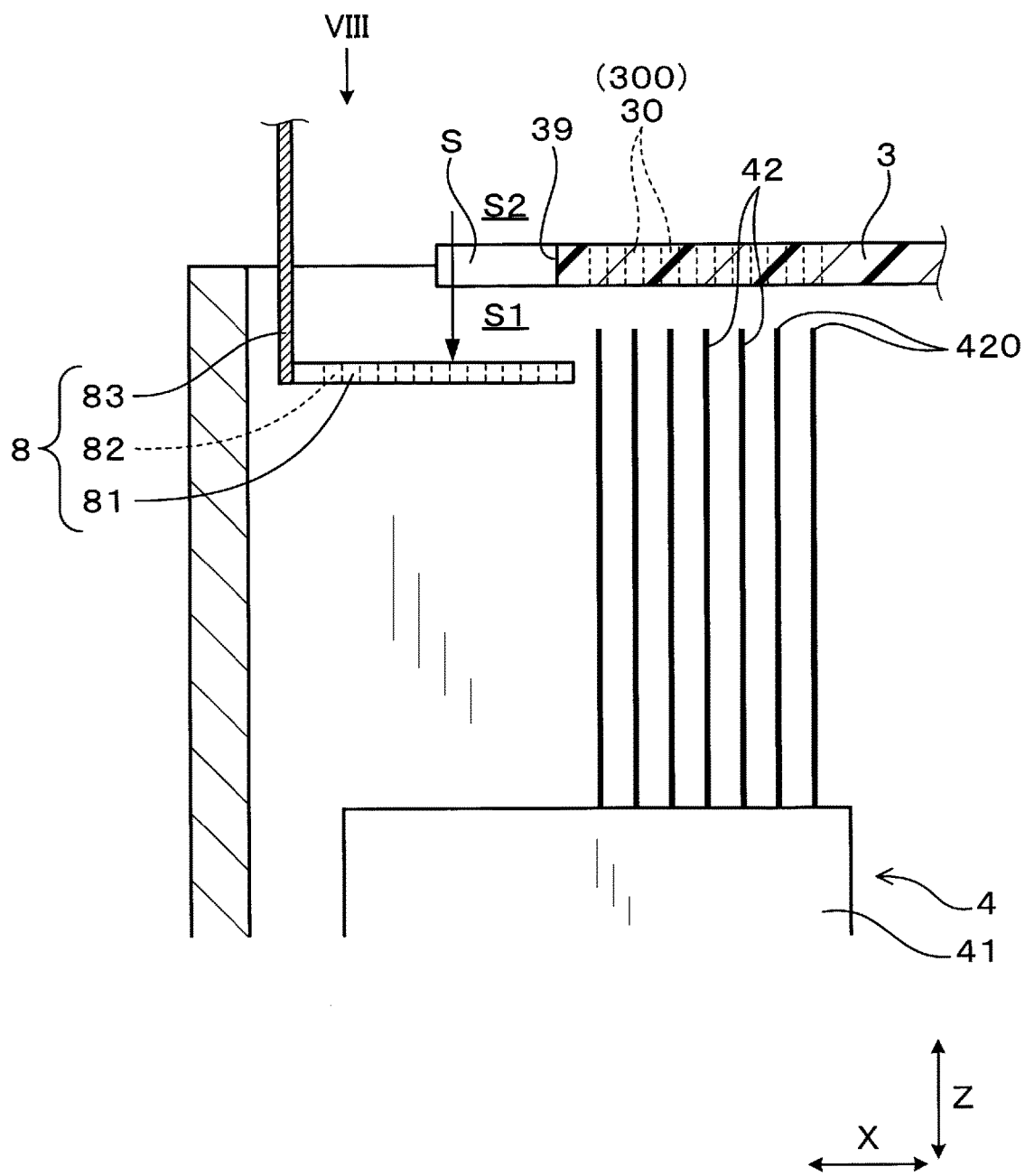
FIG. 7 is an explanatory drawing of an alignment step according to the first embodiment, and a VII-VII sectional view of FIG. 8.

As shown in FIG. 7 and FIG. 8, the jig 8 of the present embodiment includes a jig main body 81, positioning engagement parts 82, and a support part 83. The jig main body 81 extends in the X direction. The jig main body 81 is provided with the positioning engagement parts 82. The support part 83 extends in the Z direction from the jig main body 81.

Figure 9:
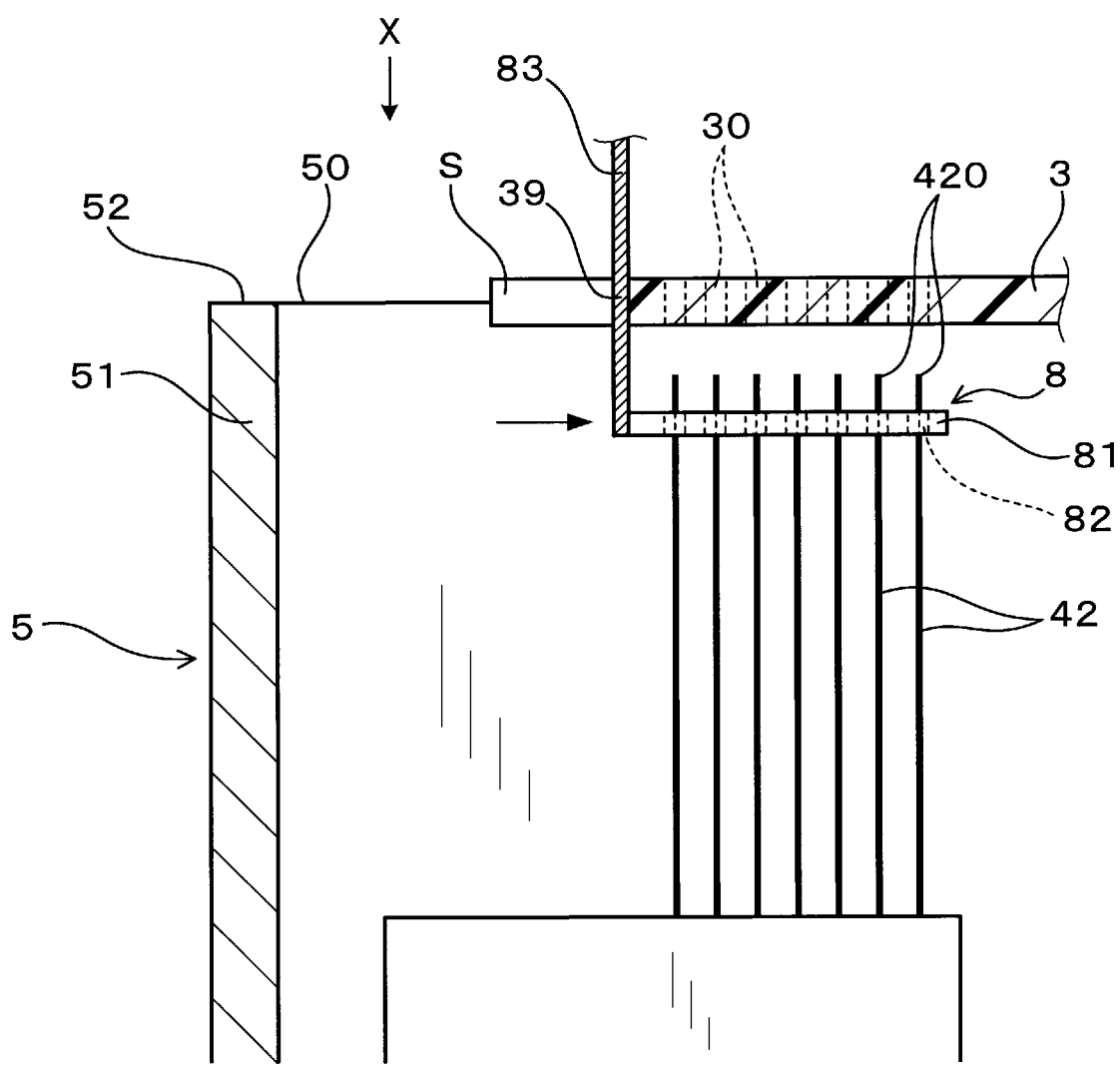
FIG. 9 is a view continued from FIG. 7.
Figure 10:
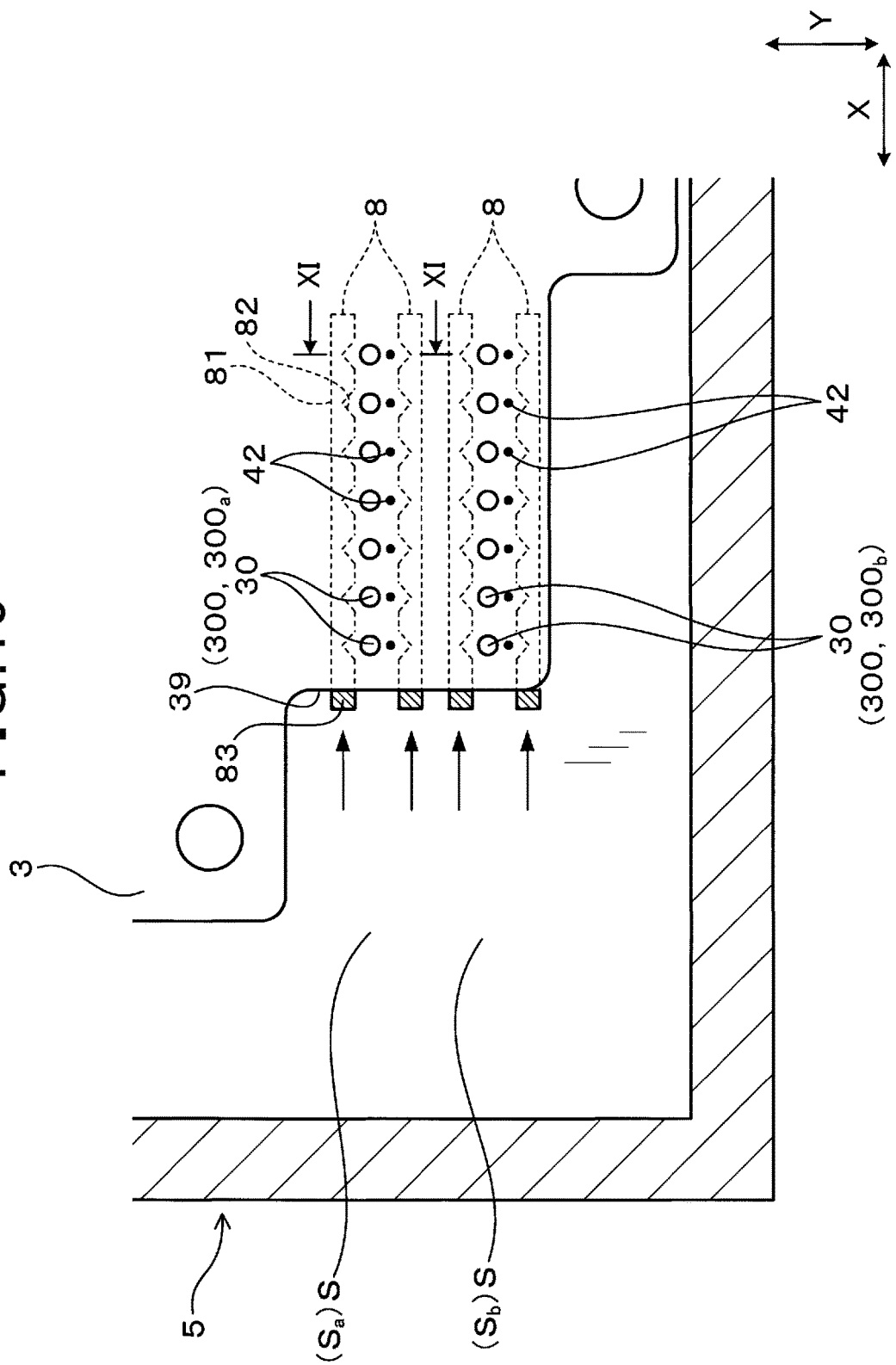
FIG. 10 is a view taken in the direction of an arrow X of FIG. 9.

As shown in FIG. 7 and FIG. 8, in the alignment step, the jig 8 is inserted in the Z direction and into the communication space S from outside the case, and the jig main body 81 is positioned in the space S1 that is closer to the component main body 41 in the Z direction than the control board 3 is. Thereafter, as shown in FIG. 9 and FIG. 10, the jig main body 81 is moved in the X direction so that the support part 83 is brought into contact with a side surface 39 of the control board. Next, as shown in FIG. 11 to FIG. 14, the jig 8 is moved in the Y direction. Thereby, the signal terminals 42 are engaged with the positioning engagement parts 82 to align the signal terminal 42 with the through holes 30.

Thereafter, the control board 3 is moved in the Z direction. Thereby, as shown in FIG. 2, the respective signal terminals 42 are inserted into the through holes 30.

As shown in FIG. 10, in the present embodiment, the plurality of signal terminals 42 are arranged in two rows. As shown in FIG. 10 to FIG. 14, the signal terminals 42 of each of the rows are held by a pair of jigs 8.

Figure 11:
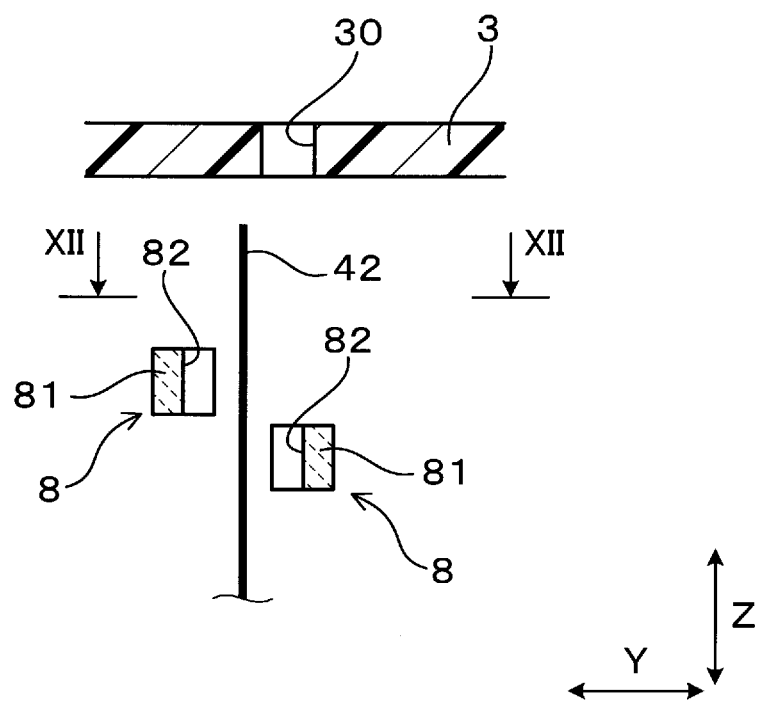
FIG. 11 is an XI-XI sectional view of FIG. 10.
Figure 12:
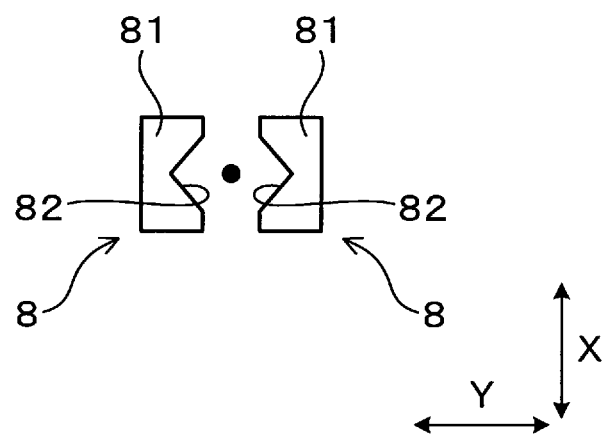
FIG. 12 is a XII-XII sectional view of FIG. 11.

As described above, the jig 8 includes the jig main body 81, the positioning engagement parts 82, and the support part 83. As shown in FIG. 12, the positioning engagement part 82 is formed so as to have a triangular chipped shape. As shown in FIG. 11, the positions of the jigs 8 holding the signal terminals 42 differ from each other in the Z direction.

As shown in FIG. 13 and FIG. 14, when the jigs 8 are moved in the Y direction, the signal terminal 42 is engaged with the positioning engagement parts 82. In addition, the signal terminal 42 is held by the pair of jigs 8. Hence, the positions of the signal terminal 42 in the X and Y directions is set. In this state, the control board 3 is moved in the Z direction so that the signal terminals 42 are inserted into the through holes 30 (refer to FIG. 2). Thereafter, the signal terminals 42 and the control board 3 are soldered together.

Effects of the present embodiment will be described. As shown in FIG. 1 and FIG. 2, in the present embodiment, the ends 420 of the signal terminals 42 are positioned in the case 5 and inward in the Z direction with respect to the opening 50 of the case 5.

Hence, the signal terminals 42 do not project from the opening 50 to the outside of the case 5, whereby the power conversion apparatus 1 can be further decreased in size.

In addition, in the present embodiment, the signal terminals 42 are inserted into the through holes 30 of the control board 3.

Figure 26:
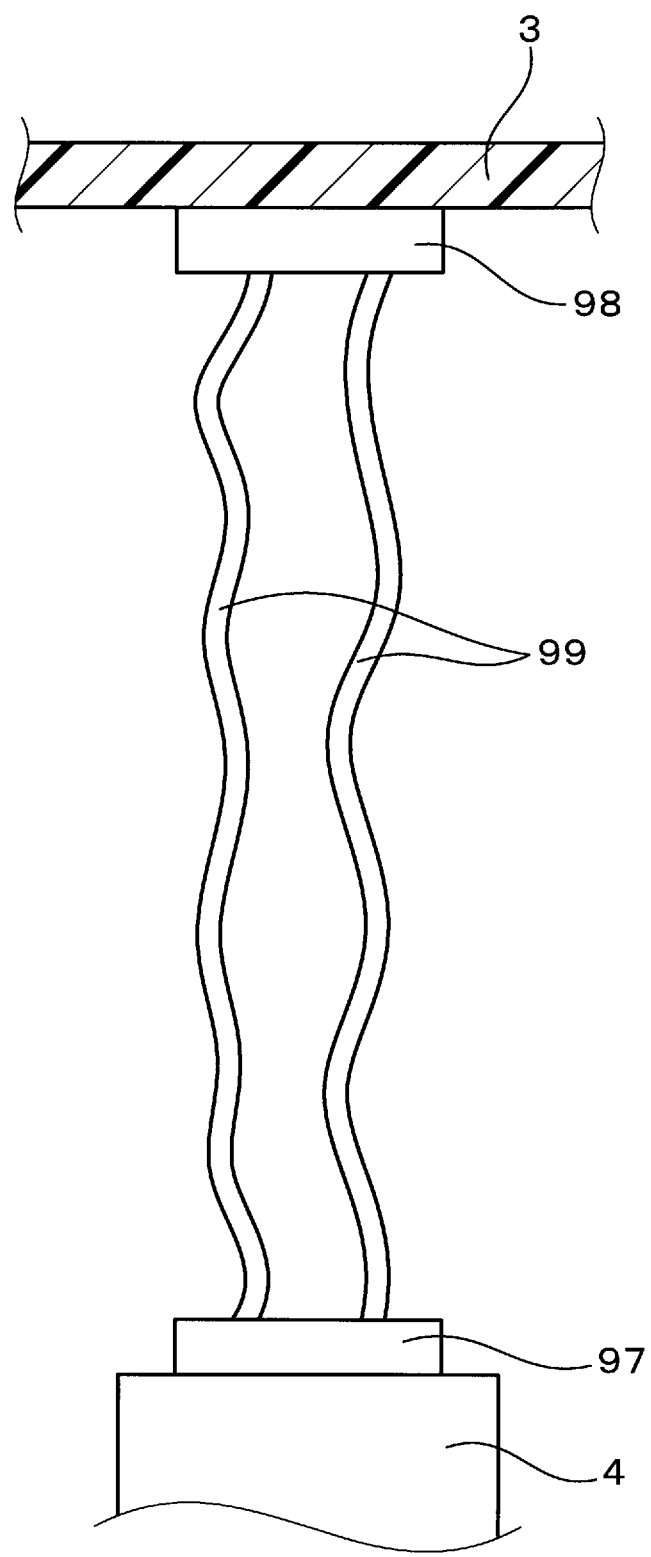
FIG. 26 is an enlarged sectional view of a main part of a power conversion apparatus according to a comparative embodiment.

Hence, the electronic component 4 and the control board 3 can be connected by the signal terminals 42 having high rigidity. Accordingly, vibration resistance of the power conversion apparatus 1 can be improved. That is, as shown in FIG. 26, if connectors 97 and 98 are respectively provided to the electronic component 4 and the control board 3, and the electronic component 4 and the control board 3 are electrically connected via wires 99 and the connectors 97 and 98, the wires 99 may be shaken if vibration is applied from the outside, which may apply stress to the connectors 97 and 98. Hence, the life of the connectors 97 and 98 may shorten. However, by using the signal terminals 42 having high rigidity as in the present embodiment, since the signal terminals 42 are difficult to shake even if vibration is applied from the outside, the application of stress to the control board 3 and the like can be suppressed. Hence, vibration resistance of the power conversion apparatus 1 can be improved.

It is noted that when the signal terminals 42 are inserted into the through holes 30 as in the present embodiment, the signal terminals 42 are necessary to be aligned with the through holes 30 when the power conversion apparatus 1 is produced. Hence, in the present embodiment, the communication space S is formed. According to the configuration, the jig 8 for positioning the signal terminals 42 can be inserted in the Z direction and into the case from the outside of the case through the communication space S (refer to FIG. 7 and FIG. 8). Thereafter, the jig 8 can be moved in the X direction (refer to FIG. 9 and FIG. 10) and can be further moved in the Y direction (refer to FIG. 13 and FIG. 14). Hence, the signal terminals 42 can be aligned by using the jig 8, and the signal terminals 42 can be easily inserted into the through holes 30 of the control board 3.

In addition, according to the present embodiment, the length $L_X$ of the communication space S in the X direction is longer than a+b. According to the configuration, when the power conversion apparatus 1 is produced, the jig having a length required for positioning all the signal terminals 42 (that is, the jig 8 having a length in the X direction equal to or more than a+b) can be inserted into the case from the outside of the case through the communication space S. Hence, all the signal terminals 42 can be positioned by using the jig 8, and the signal terminals can be easily inserted into the through holes.

That is, if the length $L_X$ of the communication space S in the X direction is shorter than a+b, the jig 8 cannot be inserted into the communication space S because the length of the jig main body 81 is required to be at least a+b. However, if the length $L_X$ of the communication space S in the X direction is longer than a+b, the jig 8 can be inserted into the communication space S.

It is noted that, in the present embodiment, as described above, the ends 420 of the signal terminals 42 are positioned in the case and inward in the Z direction with respect to the opening 50. Hence, the jig 8 cannot be inserted in the X direction or the Y direction from outside the case because of the presence of the sidewall 51 of the case 5. However, as shown in FIG. 7 and FIG. 8, forming the communication space S allows the jig 8 to be inserted in the Z direction. Then, further moving the jig 8 in the X direction (refer to FIG. 9 and FIG. 10) and thereafter moving the jig 8 in the Y direction (refer to FIG. 13 and FIG. 14) can easily position the signal terminals 42 by using the jig 8 regardless of the presence of the sidewall 51 of the case 5.

In addition, in the method of producing the power conversion apparatus according to the present embodiment, the board arrangement step (refer to FIG. 6), the alignment step (refer to FIG. 7 to FIG. 14), and the insertion step (refer to FIG. 2) are performed. In the alignment step, the jig is inserted in the Z direction. Thereafter, the jig is moved in the X direction and is further moved in the Y direction. Hence, the signal terminals 42 can be easily positioned by using the jig 8 regardless of the presence of the sidewall 51 of the case 5.

In addition, in the present embodiment, the length $L_X$ of the communication space S in the X direction is a+b+4 (m) or more.

In this case, the signal terminals 42 can be reliably positioned by using the jig 8. That is, as shown in FIG. 8, the length of the jig main body 81 in the X direction is required to be at least a+b. In addition, the length of the support part 83 in the X direction is often required to be 4 mm or more for a reason of processing accuracy. Hence, if the length $L_X$ of the communication space S in the X direction is a+b+4 (mm) or more, even when the length of the jig main body 81 in the X direction is a+b, and the length of the support part 83 in the X direction is 4 mm, the jig 8 can be inserted into the communication space S. Hence, the signal terminals 42 can be reliably aligned by using the jig 8.

In addition, in the present embodiment, the length $L_Y$ of each of the communication spaces S in the Y direction is 3c or more.

Hence, the signal terminals 42 can be reliably aligned. That is, if the length $L_Y$ of the communication space S in the Y direction is less than 3c, when the jig 8 is moved in the X direction (refer to FIG. 10), the jig 8 is likely to come into contact with the signal terminals 42. However, if the length $L_Y$ in the Y direction is 3c or more, the jig 8 can be sufficiently separated from the signal terminals 42 in the Y direction. Hence, such a problem can be prevented.

In addition, as shown in FIG. 3, the communication space S of the present embodiment is formed between the side surface 39 of the control board 3 and the sidewall 51 of the case 5.

Figure 16:
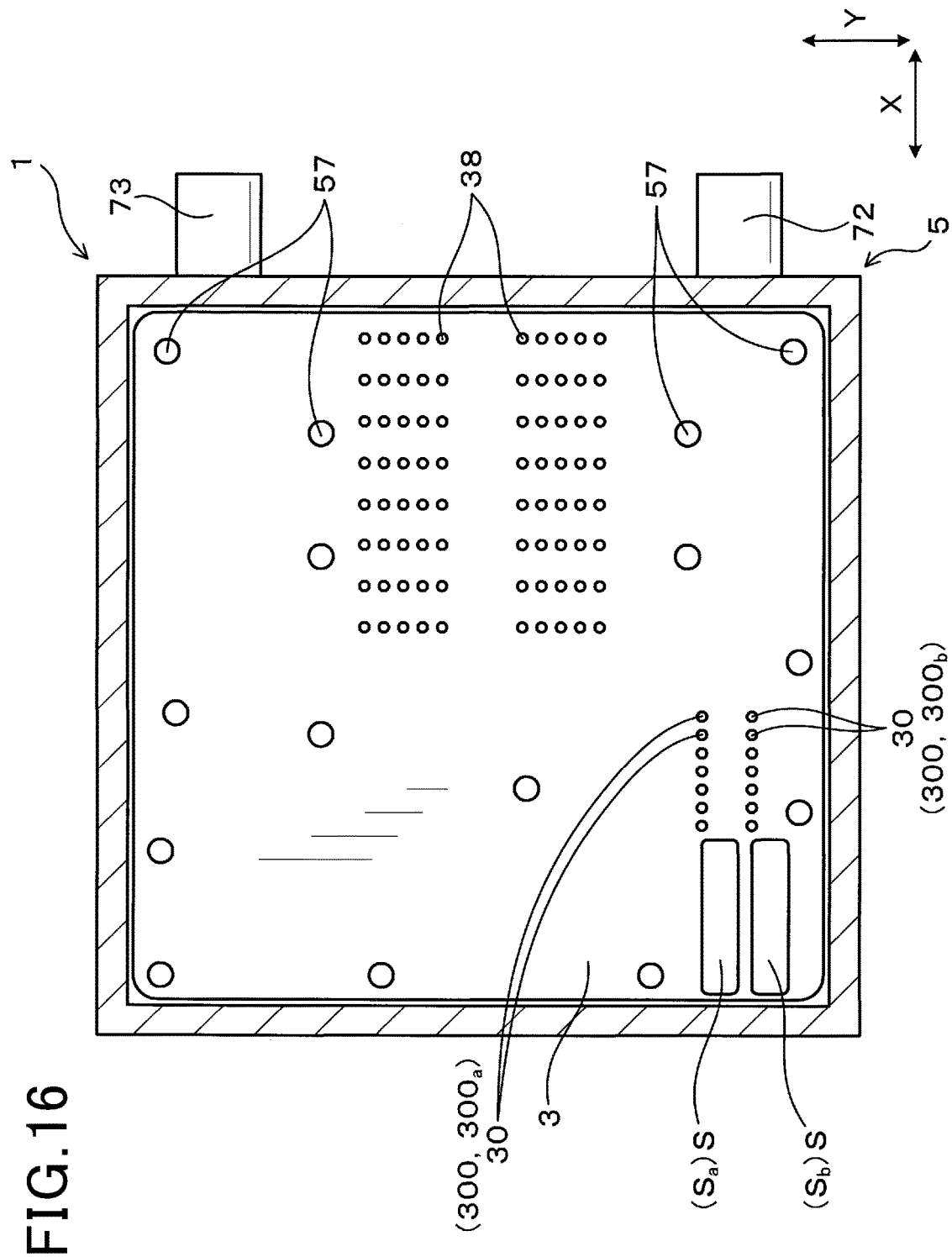
FIG. 16 is a sectional view of a power conversion apparatus according to a second embodiment.

As described later, although the communication space S may be a through hole formed in the control board 3 (refer to FIG. 16), processing of the control board 3 is likely to be difficult. However, forming the communication space S between the side surface 39 of the control board 3 and the sidewall 51 can easily produce the control board 3.

In addition, as shown in FIG. 8, in the present embodiment, a plurality of through hole groups 300 are formed so as to be adjacent to each other in the Y direction. The distance D between the two through holes 30 adjacent to each other in the Y direction is 3c or more.

Hence, the distance between the signal terminals 42, which are inserted into the through holes 30, in the Y direction can be sufficiently widened. Hence, when the jig 8 is moved in the X direction, the jig 8 can be prevented from coming into contact with the signal terminal 42 adjacent to the target signal terminal 42 in the Y direction.

In addition, in the present embodiment, the signal terminals 42 are connected to the control board 3 by soldering.

Hence, the control board 3 can be decreased in size. The signal terminals 42 may be electrically connected to the control board 3 in such a manner that the signal terminals 42 are inserted into the through holes 30, and thereafter a connector, not shown, is inserted. However, in this case, the force generated when the connector is inserted may bend the control board 3, thereby applying stress to components mounted in the vicinity of the through holes 30, such as a resistor and a microcomputer. Hence, the components cannot be disposed in the vicinity of the through holes 30, whereby the control board 3 easily increases in size. However, according to the present embodiment, since the signal terminals 42 are soldered to the control board 3, stress can be prevented from being applied to the control board 3, whereby the components can be disposed in the vicinity of the through holes 30. Hence, the control board 3 can be decreased in size.

In the present embodiment, as shown in FIG. 3, the communication space S is formed in the vicinity of the through hole groups 300. Hence, the posts 57 supporting the control board 3 cannot be disposed at the position where the communication space S is formed. Hence, if the above connector is used, the control board 3 bends when the connector is inserted, whereby a problem arises very easily that stress is applied to the components disposed in the vicinity of the signal terminals 42. However, soldering the signal terminals 42 and the control board 3 together can prevent the control board 3 from bending, which can solve the above problem.

In addition, as shown in FIG. 15, in the present embodiment, the AC motor 9 is driven by using a power converter circuit 10 configured by the semiconductor elements 20. As shown in FIG. 1, the case 5 of the power conversion apparatus 1 is attached to the AC motor 9.

In this case, since strong vibration is transmitted from the AC motor 9 to the power conversion apparatus 1, vibration resistance of power conversion apparatus 1 is strongly required to be increased. Hence, a beneficial effect is obtained by connecting the electronic component 4 and the control board 3 via the signal terminals 42 having high rigidity to increase the vibration resistance.

In addition, as shown in FIG. 1, in the present embodiment, the signal terminals 42 are longer than the module control terminals 22.

Hence, when the power conversion apparatus 1 is produced, since the displacement of the signal terminals 42 is large, positioning the signal terminals 42 is highly required. Hence, a beneficial effect is obtained by forming the communication space S so that the jig 8 for positioning can be inserted.

As described above, according to the present embodiment, a power conversion apparatus can be provided whose vibration resistance is improved and which is further decreased in size.

Although the current sensor $4_I$ is used as the electronic component 4, this is not a limitation. For example, a voltage sensor measuring voltage of the smoothing capacitor 142 (refer to FIG. 15) may be used as the electronic component 4.

In the following embodiments, in the drawings, the same reference numerals as those used in the first embodiment denote components similar to those in the first embodiment unless otherwise stated.

Second Embodiment

In the present embodiment, the configuration of the communication space S is modified. As shown in FIG. 15, in the present embodiment, the communication space S is a through hole formed the control board 3. In addition, the control board 3 of the present embodiment includes two communication space S ($S_a$, $S_b$) and two through hole groups 300 ($300_a$, $300_b$). The communication spaces S are provided at positions adjacent to the respective through hole groups 300 in the X direction.

Figure 17:
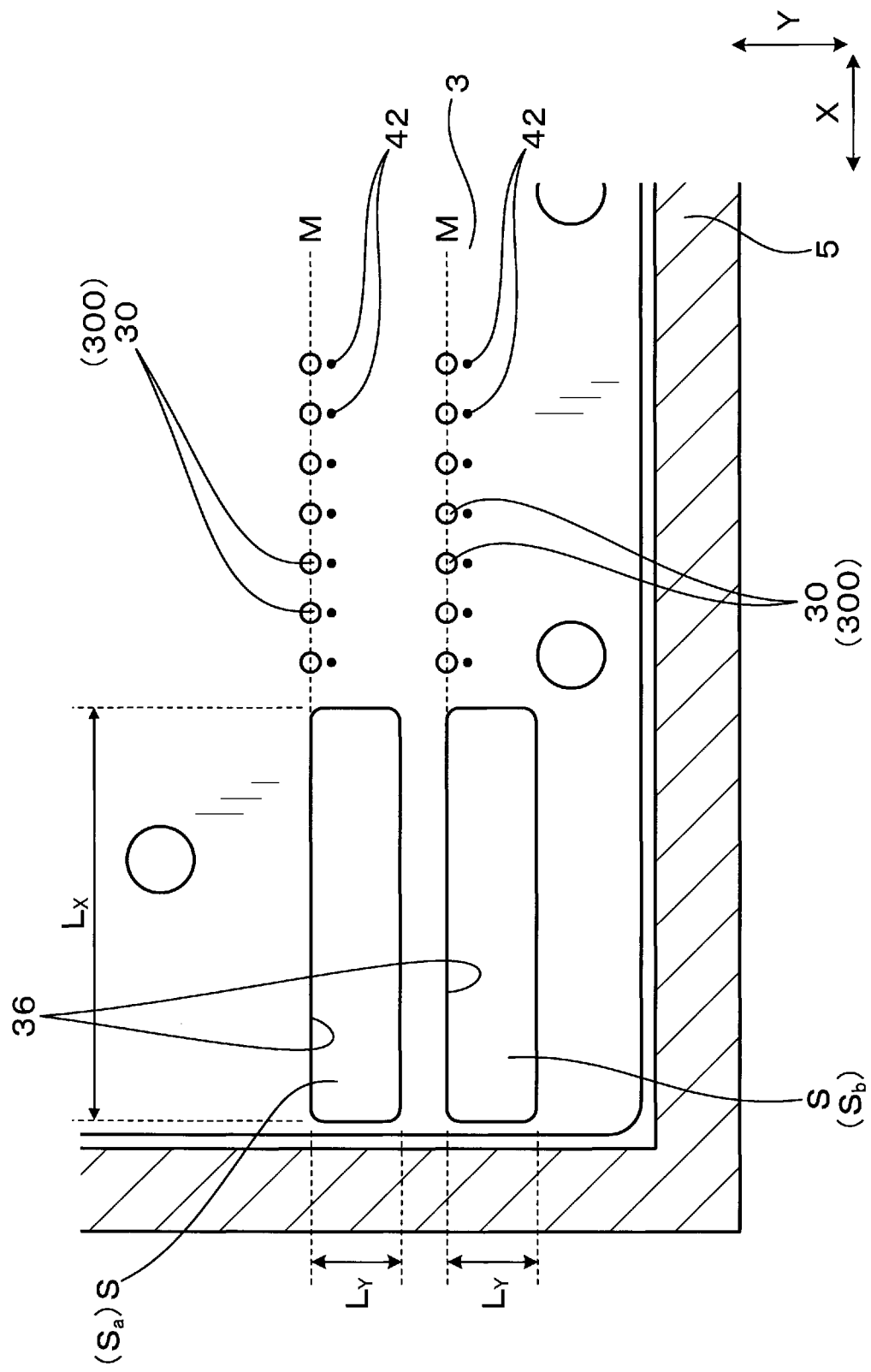
FIG. 17 is an enlarged view of a main part of FIG. 16.

As shown in FIG. 17, part of a borderline 36 between the communication space S and the control board 3 is on a straight line M passing through the centers of the plurality of through holes 30. The length $L_X$ of the communication space S in the X direction is, as in the first embodiment, a+b+4 (mm) or more. In addition, the length $L_Y$ of the communication space S in the Y direction is 3c or more.

Figure 18:
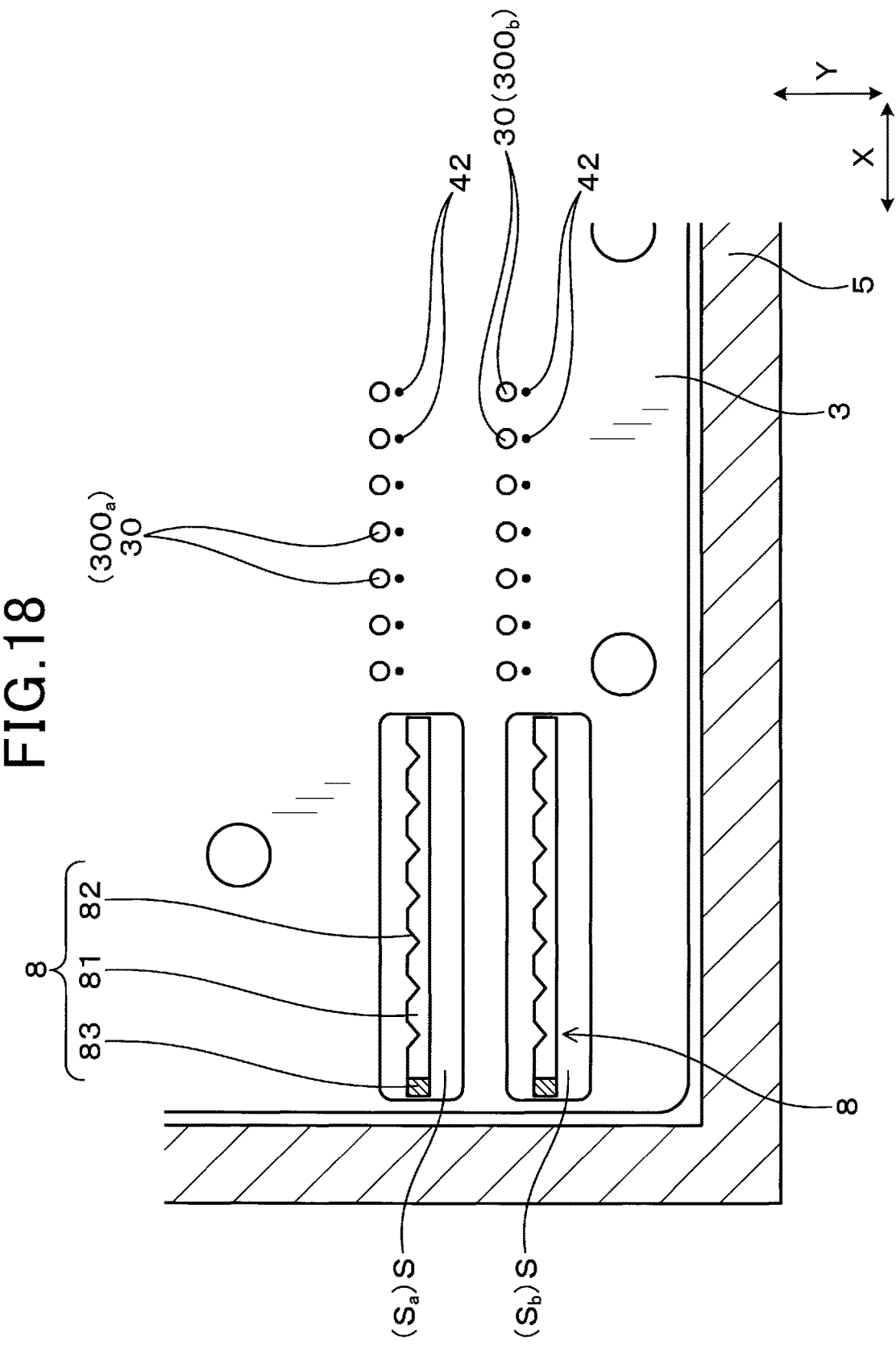
FIG. 18 is an explanatory drawing of a manufacturing process of the power conversion apparatus according to the second embodiment.
Figure 19:
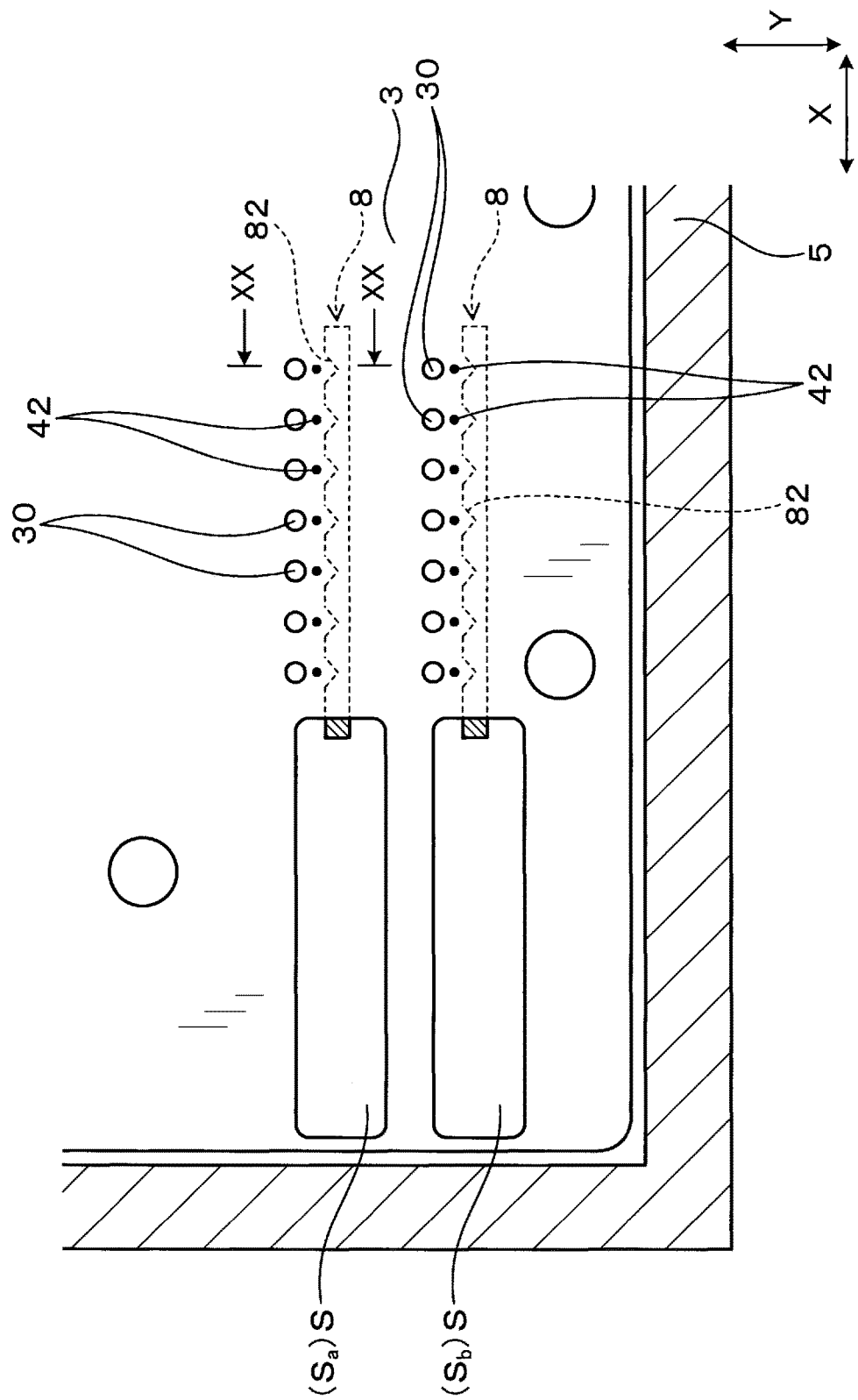
FIG. 19 is a view continued from FIG. 18.
Figure 20:
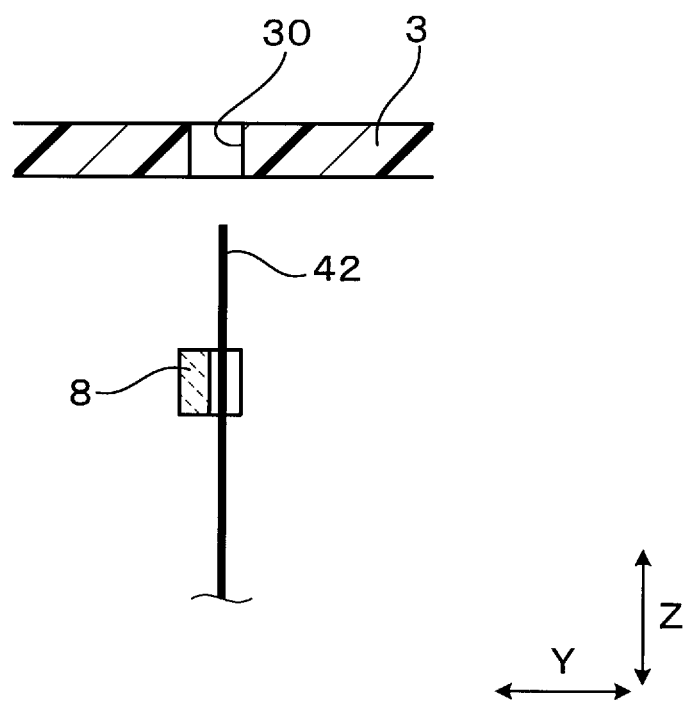
FIG. 20 is a XX-XX sectional view of FIG. 19.

When the power conversion apparatus 1 is produced, the board arrangement step, the alignment step, and the insertion step are performed as in the first embodiment. The jig 8 of the present embodiment includes, as in the first embodiment, the jig main body 81, the positioning engagement parts 82, and the support part 83. In addition, in the present embodiment, as shown in FIG. 18 to FIG. 20, each of the signal terminals 42 is positioned by using one jig 8. Before the alignment step, as shown in FIG. 18, force is applied to each of the signal terminals 42 to displace the signal terminals 42 toward the communication space S side in the Y direction.

In the alignment step, as shown in FIG. 18, the jig 8 is first moved in the Z direction and is inserted into the case 5 through the communication space S. Thereafter, as shown in FIG. 19, the jig 8 is moved in the X direction and is, as shown in FIG. 20, further moved in the Y direction. Hence, the signal terminals 42 are engaged with the positioning engagement parts 82, so that the signal terminals 42 are positioned. Next, the control board 3 is moved in the Z direction, so that the signal terminals 42 are inserted into the through holes 30.

Effects of the present embodiment will be described. As shown in FIG. 17, in the present embodiment, when viewed in the Z direction, part of the borderline 36 between the communication space S and the control board 3 is on the straight line M passing through the centers of the plurality of through holes 30. That is, the communication space S is provided at only one side of the straight line M in the Y direction.

Hence, the area of the communication space S can be minimized, and other components can be mounted in the vicinity of the communication space S. Hence, the control board 3 can be decreased in size.

In addition, the present embodiment provides configurations and effects similar to those of the first embodiment.

Third Embodiment

Figure 21:
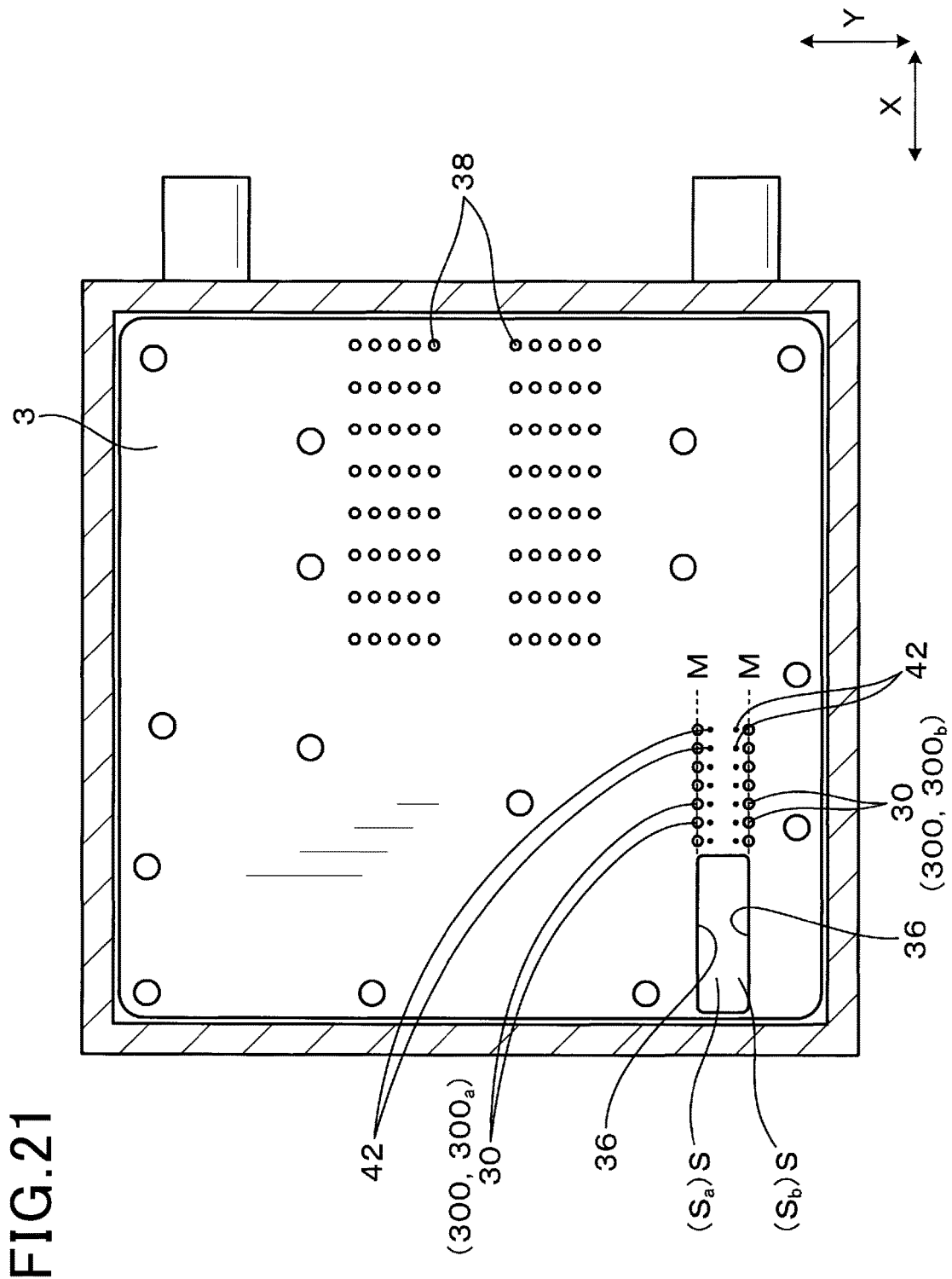
FIG. 21 is a sectional view of a power conversion apparatus according to a third embodiment.
Figure 22:
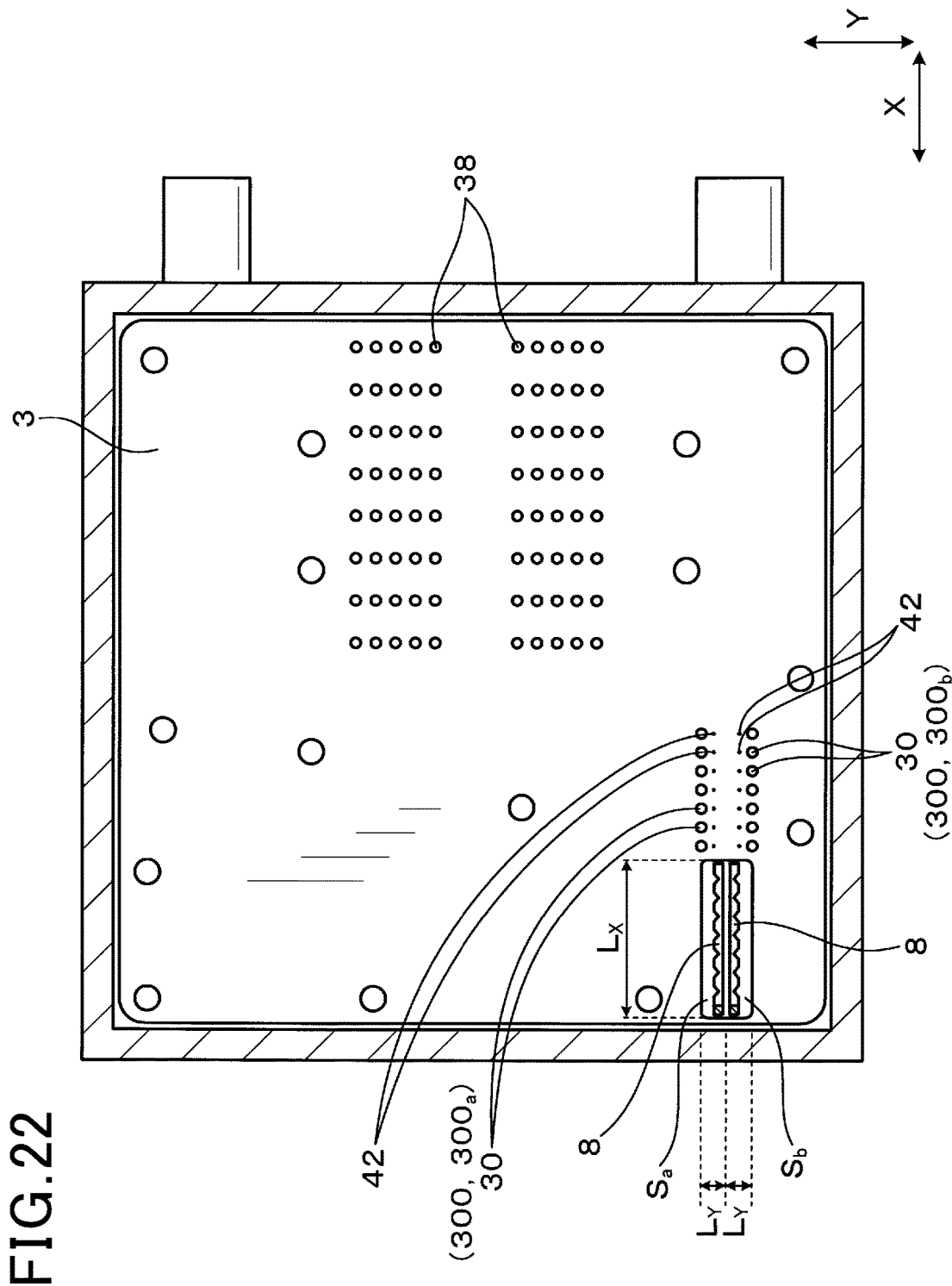
FIG. 22 is an explanatory drawing of a manufacturing process of the power conversion apparatus according to the third embodiment.

In the present embodiment, the configuration of the communication space S is modified. As shown in FIG. 21 and FIG. 22, in the present embodiment, as in the second embodiment, the communication space S is a through hole formed the control board 3. In addition, the first communication space $S_a$ formed at a position adjacent to the first through hole group $300_a$ communicates with the second communication space $S_b$ formed at a position adjacent to the second through hole group $300_b$.

As in the second embodiment, part of the borderline 36 between the communication space S and the control board 3 is on the straight line M passing through the centers of the plurality of through holes 30. In addition, in the present embodiment, as in the first embodiment, the length $L_X$ of each of the communication spaces $S_a$ and $S_b$ in the X direction is a+b+4 (mm) or more, and the length $L_Y$ of each of the communication spaces $S_a$ and $S_b$ in the Y direction is 3c or more.

Each of the signal terminals 42 is positioned by using one jig 8. Before the alignment step, force is applied to the signal terminals 42 to displace the signal terminals 42 toward the communication space S side in the Y direction with respect to the through holes 30. Then, in the alignment step, the signal terminals 42 are displaced in the Y direction by using the jig 8, so that the signal terminals 42 are positioned with respect to the through holes 30.

In addition, the present embodiment provides configurations and effects similar to those of the first embodiment.

Fourth Embodiment

Figure 23:
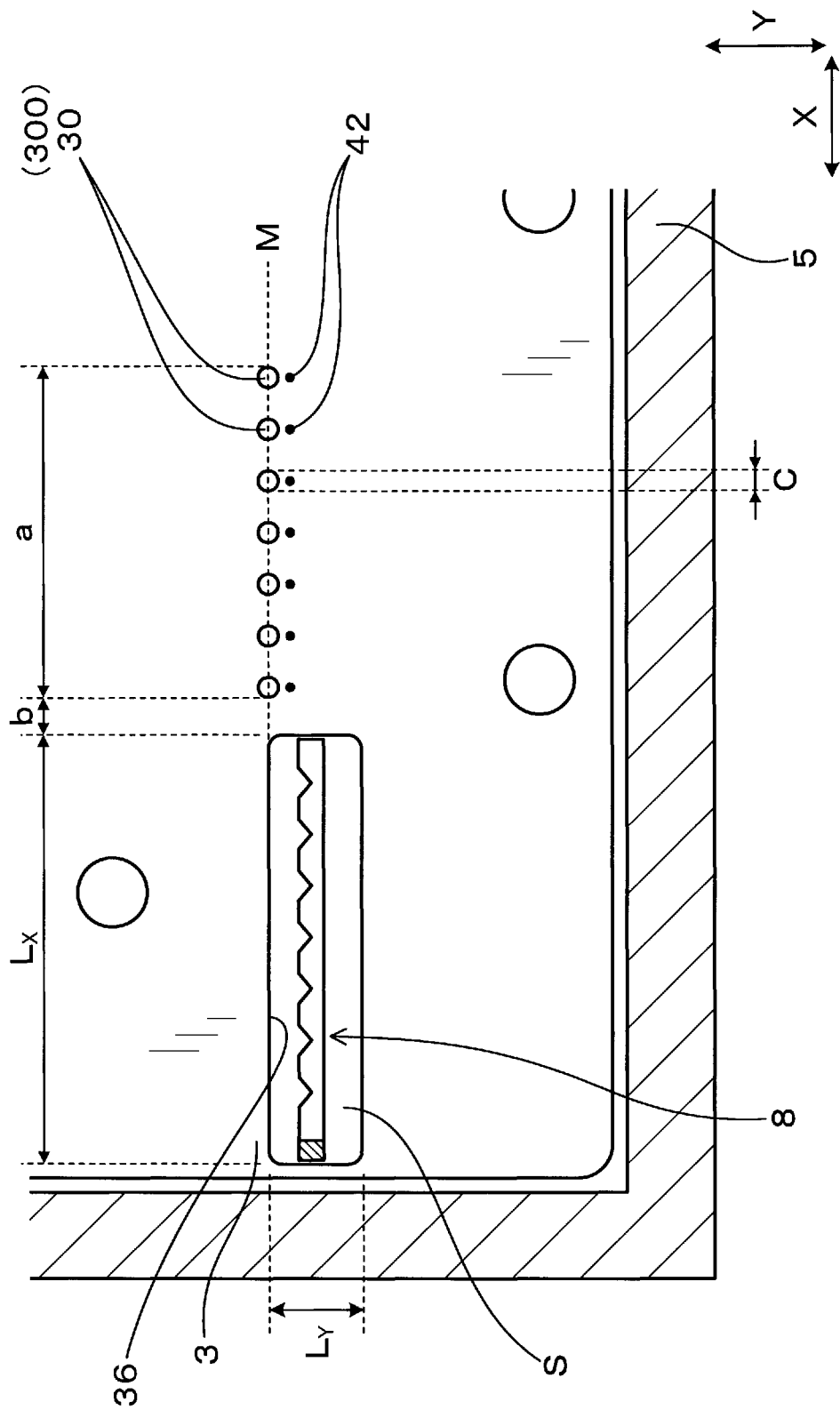
FIG. 23 is an explanatory drawing of a manufacturing process of a power conversion apparatus according to a fourth embodiment.

In the present embodiment, the configuration of the through hole group 300 is modified. As shown in FIG. 23, in the present embodiment, the control board 3 is provided with only one through hole group 300. The communication space S is formed at a position adjacent to the through hole group 300 in the X direction. The communication space S is a through hole formed in the control board 3. In addition, in the present embodiment, as in the second embodiment, part of the borderline 36 between the communication space S and the control board 3 is on the straight line M passing through the centers of the plurality of through holes 30. In addition, as in the first embodiment, the length $L_x$ of the communication space S in the X direction is a+b+4 (mm) or more, and the length $L_Y$ of the communication space in the Y direction is $3c$ or more.

In addition, the present embodiment provides configurations and effects similar to those of the first embodiment.

Fifth Embodiment

Figure 24:
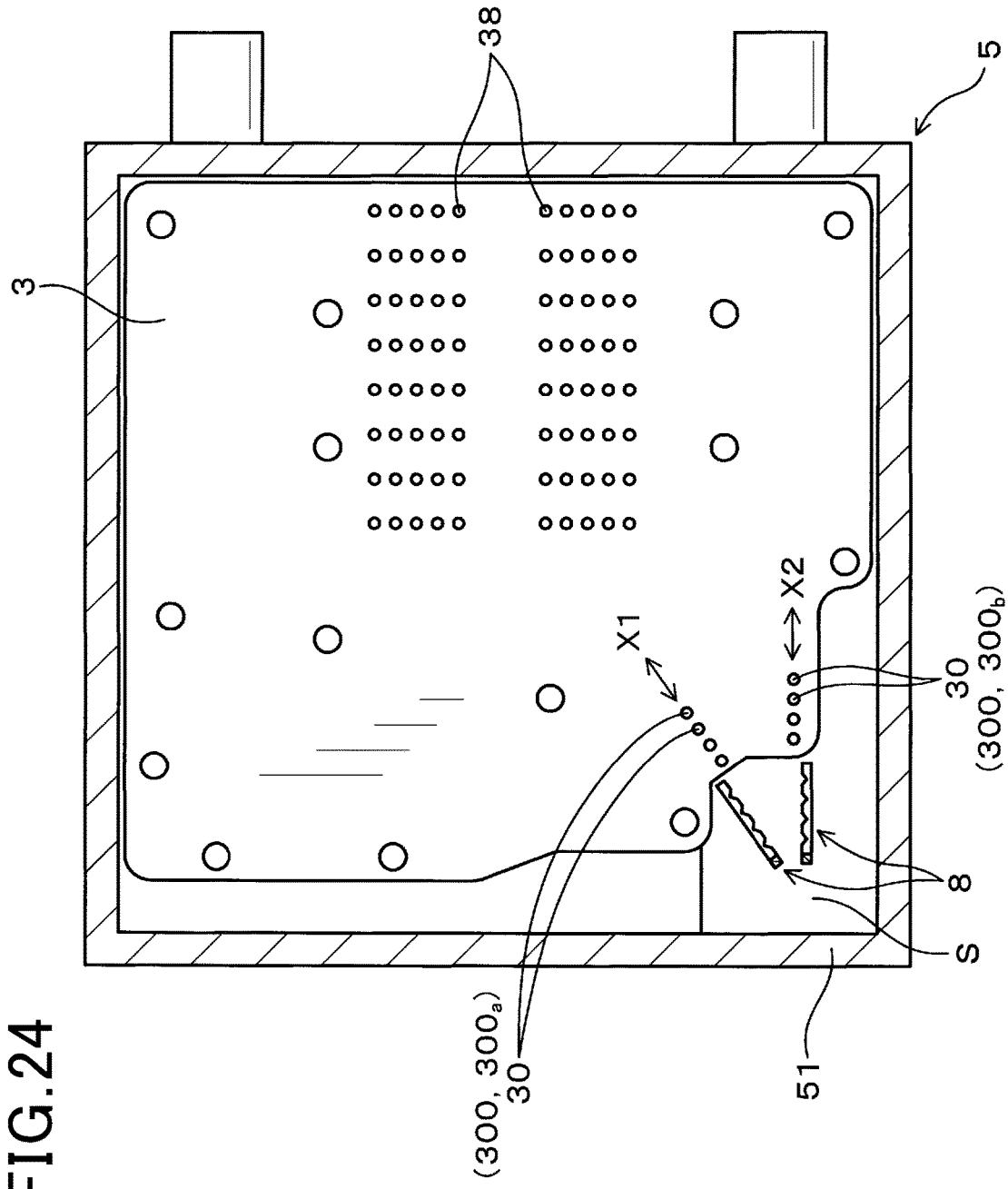
FIG. 24 is an explanatory drawing of a manufacturing process of a power conversion apparatus according to a fifth embodiment.

In the present embodiment, the configuration of the through hole group 300 is modified. As shown in FIG. 24, in the present embodiment, the first through hole group $300_a$ and the second through hole group $300_b$ are not parallel to each other. That is, an arrangement direction X1 of the plurality of through holes 30 configuring the first through hole group $300_a$ and an arrangement direction X2 of the plurality of through holes 30 configuring the second through hole group $300_b$ are not parallel to each other.

In addition, the present embodiment provides configurations and effects similar to those of the first embodiment.

Sixth Embodiment

Figure 25:
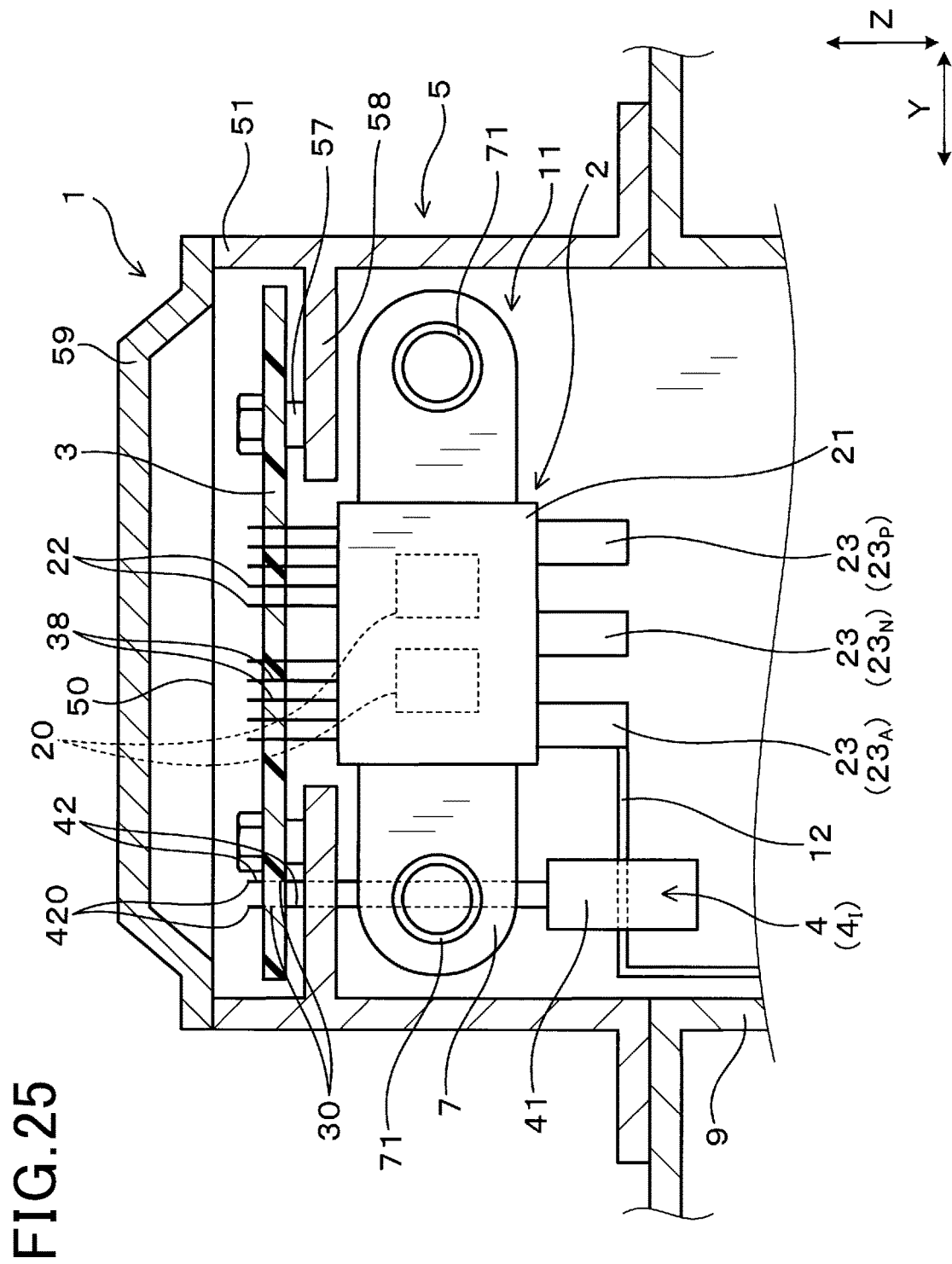
FIG. 25 is a sectional view of a power conversion apparatus according to a sixth embodiment.

In the present embodiment, the configuration of the electronic component 4 (current sensor 41) is modified. As shown in FIG. 25, in the present embodiment, all the parts of the component main body 41 are disposed so as to be closer to the AC motor 9 in the Z direction than the cooling tube 7 is.

In the above configuration, the signal terminals 42 are liable to be long. Hence, when the power conversion apparatus 1 is produced, since the displacement of the signal terminals 42 is large, it is difficult to insert the signal terminals 42 into the through holes 30. Hence, a beneficial effect is obtained by forming the communication space S (refer to FIG. 3) so that the signal terminals 42 can be aligned with the through holes 30 by using the jig 8.

In addition, the present embodiment provides configurations and effects similar to those of the first embodiment.

Hereinafter, an aspect of the above-described embodiments will be summarized.

As a first aspect of the embodiment, a power conversion apparatus (1) is provided which includes:

a semiconductor module (2) that includes a module main body (21) including a semiconductor element (20), and a module control terminal (22) projecting from the module main body;

a control board (3) that is connected to the module control terminal and controls switching operation of the semiconductor element;

an electronic component (4) that is connected to the control board; and a case (5) that houses the semiconductor module, the control board, and the electronic component, wherein the electronic component includes a component main body (41) and a plurality of signal terminals (42) that project from the component main body in a projection direction (Z) of the module control terminal, the plurality of signal terminals being arranged in an arrangement direction (X) orthogonal to the projection direction, a plurality of through holes (30) are formed in the control board, and the signal terminals are inserted into the respective through holes, in the case, an opening (50) that opens in the projection direction is formed, and ends (420) of the signal terminals are positioned inward in the projection direction with respect to the opening, at a position adjacent to at least one through hole group (300), which includes the plurality of through holes, in the arrangement direction, a communication space (S) is formed which makes a first space (S1), which is positioned at a side of the electronic component in the projection direction with respect to the control board, communicate with a second space (S2) opposite to the first space with referenced to the control board, and when a length of the through hole group in the arrangement direction is a, and a distance between the through hole group and the communication space in the arrangement direction is b, a length ($L_X$) of the communication space in the arrangement direction is longer than a+b.

As a second aspect of the embodiment, a method of producing the power conversion apparatus is provided, the method including:

a board arrangement step of housing the semiconductor module and the electronic component in the case, and disposing the control board at a position adjacent to the semiconductor module and the electronic component in the projection direction, an alignment step of inserting a jig, which includes a jig main body (81) extending in the arrangement direction, a positioning engagement part (82) provided to the jig main body and engaged with the signal terminal, and a support part (83) extending in the projection direction from the jig main body, in the projection direction and into the communication space from outside the case, of positioning the jig main body in a space that is closer to the component main body in the projection direction than the control board is, of moving thereafter the jig in the arrangement direction, and of then moving the jig in an orthogonal direction orthogonal to the projection direction and the arrangement direction, whereby the positioning engagement part is engaged with the signal terminal, and the signal terminal is aligned with the through hole, and an insertion step of moving the control board in the projection direction to insert the signal terminal into the through hole.

In the power conversion apparatus, the ends of the signal terminals are positioned in the case and inward in the projection direction with respect to the opening of the case.

Hence, the signal terminals do not project from the opening to the outside of the case, whereby the power conversion apparatus can be further decreased in size.

In addition, in the power conversion apparatus, the signal terminals are inserted into the through holes of the control board.

Hence, the electronic component and the control board can be connected by the signal terminals having high rigidity. Therefore, vibration resistance of the power conversion apparatus can be improved.

As described above, when the signal terminals are inserted into the through holes, the signal terminals are necessary to be aligned with the through holes when the power conversion apparatus is produced. Hence, in the present embodiment, the communication space is formed. According to the configuration, the jig for positioning the signal terminals can be inserted in the projection direction and into the case from the outside of the case through the communication space (refer to FIG. 7 and FIG. 8). Thereafter, the jig can be moved in the arrangement direction (refer to FIG. 9 and FIG. 10) and can be further moved in the orthogonal direction (refer to FIG. 13 and FIG. 14). Hence, the signal terminals can be aligned by using the jig, and the signal terminals can be easily inserted into the through holes of the control board.

In addition, according to the present aspect, the length of the communication space in the arrangement direction is longer than a+b. According to the configuration, when the power conversion apparatus is produced, the jig having a length required for positioning all the signal terminals (that is, the jig having a length in the arrangement direction equal to or more than a+b) can be inserted into the case from the outside of the case through the communication space. Hence, all the signal terminals can be positioned by using the jig, and the signal terminals can be easily inserted into the through holes.

It is noted that, in the present aspect, as described above, the ends of the signal terminals are positioned in the case and inward in the projection direction with respect to the opening of the case. Hence, the jig cannot be inserted in the arrangement direction or the orthogonal direction from outside the case because of the presence of the sidewall of the case. However, forming the communication space allows the jig to be inserted in the projection direction. Then, further moving the jig in the arrangement direction and thereafter moving the jig in the orthogonal direction can easily position the signal terminals by using the jig regardless of the presence of the sidewall of the case.

In addition, in the method of producing the power conversion apparatus according to the second aspect, the board arrangement step, the alignment step, and the insertion step are performed. In the alignment step, the jig is inserted in the projection direction. Thereafter, the jig is moved in the arrangement direction and is further moved in the orthogonal direction. Hence, the signal terminals can be easily positioned by using the jig regardless of the presence of the sidewall of the case.

As described above, according to the above aspect, a power conversion apparatus can be provided whose vibration resistance is improved and which is further decreased in size.

What is claimed is:
1. A power conversion apparatus that includes:
   a semiconductor module that includes a module main body including a semiconductor element, and a module control terminal projecting from the module main body;
   a control board that is connected to the module control terminal and controls switching operation of the semiconductor element;
   an electronic component that is connected to the control board; and
   a case that houses the semiconductor module, the control board, and the electronic component, wherein
   the electronic component includes a component main body and a plurality of signal terminals that project from the component main body in a projection direction of the module control terminal, the plurality of signal terminals being arranged in an arrangement direction orthogonal to the projection direction,
   a plurality of through holes are formed in the control board, and the signal terminals are inserted into the respective through holes,
   in the case, an opening that opens in the projection direction is formed, and ends of the signal terminals are positioned inward in the projection direction with respect to the opening,
   at a position adjacent to at least one through hole group, which includes the plurality of through holes, in the arrangement direction, a communication space is formed which makes a first space, which is positioned at a side of the electronic component in the projection direction with respect to the control board, communicate with a second space opposite to the first space with referenced to the control board, and
   when a length of the through hole group in the arrangement direction is a, and a distance between the through hole group and the communication space in the arrangement direction is b, a length of the communication space in the arrangement direction is longer than a+b.

2. The power conversion apparatus according to claim 1, wherein
   when a diameter of each of the through holes is c, a length of the communication space in the arrangement direction is a+b+4 (mm) or more, and a length of the communication space in an orthogonal direction orthogonal to both the arrangement and projection directions is or more.

3. The power conversion apparatus according to claim 2, wherein
   the through hole groups are arranged in the orthogonal direction so as to be adjacent to each other, and a distance between two of the through holes adjacent to each other in the orthogonal direction is 3c or more.

4. The power conversion apparatus according to claim 1, wherein
   when viewed in the projection direction, part of a borderline between the communication space and the control board is on a straight line passing through centers of the plurality of through holes configuring the through hole group.

5. The power conversion apparatus according to claim 1, wherein
   the communication space is formed between a side surface of the control board and a sidewall of the case.

6. The power conversion apparatus according to claim 1, wherein
   the signal terminals are connected to the control board by soldering.

7. The power conversion apparatus according to claim 1, wherein
   an AC motor is driven by using a power converter circuit configured by the semiconductor element, and the case is attached to the AC motor.

8. A method of producing the power conversion apparatus according to claim 1, the method comprising:
   a board arrangement step of housing the semiconductor module and the electronic component in the case, and disposing the control board at a position adjacent to the semiconductor module and the electronic component in the projection direction,
   an alignment step of inserting a jig, which includes a jig main body extending in the arrangement direction, a positioning engagement part provided to the jig main body and engaged with the signal terminal, and a support part extending in the projection direction from the jig main body, in the projection direction and into the communication space from outside the case, of positioning the jig main body in a space that is closer to the component main body in the projection direction than the control board is, of moving thereafter the jig in the arrangement direction, and of then moving the jig in an orthogonal direction orthogonal to the projection direction and the arrangement direction, whereby the positioning engagement part is engaged with the signal terminal, and the signal terminal is aligned with the through hole, and an insertion step of moving the control board in the projection direction to insert the signal terminal into the through hole.

\* \* \* \* \*